United States Patent
Nakajima et al.

(10) Patent No.: US 9,917,049 B2
(45) Date of Patent: Mar. 13, 2018

(54) SEMICONDUCTOR DEVICE HAVING CONTACTS IN DRAWING AREA AND THE CONTACTS CONNECTED TO WORD LINES EXTENDING FROM ELEMENT FORMATION AREA

(71) Applicant: Toshiba Memory Corporation, Tokyo (JP)

(72) Inventors: Fumiharu Nakajima, Yokohama (JP); Toshiya Kotani, Machida (JP); Hiromitsu Mashita, Yokohama (JP); Takafumi Taguchi, Yokohama (JP); Ryota Aburada, Kawasaki (JP); Chikaaki Kodama, Yokohama (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/226,852

(22) Filed: Aug. 2, 2016

(65) Prior Publication Data
US 2016/0343658 A1  Nov. 24, 2016

Related U.S. Application Data

(60) Division of application No. 14/858,726, filed on Sep. 18, 2015, now abandoned, which is a continuation of
(Continued)

(30) Foreign Application Priority Data

Mar. 24, 2011  (JP) ................................. 2011-066181

(51) Int. Cl.
*H01L 23/522* (2006.01)
*H01L 21/033* (2006.01)
(Continued)

(52) U.S. Cl.
CPC ...... *H01L 23/5226* (2013.01); *H01L 21/0337* (2013.01); *H01L 21/0338* (2013.01);
(Continued)

(58) Field of Classification Search
CPC ........... H01L 23/5226; H01L 27/11524; H01L 27/1157
See application file for complete search history.

(56) References Cited

U.S. PATENT DOCUMENTS 7,592,225 B2   9/2009   Kai et al.
7,713,833 B2   5/2010   Mashita et al.
(Continued)

FOREIGN PATENT DOCUMENTS

JP   2008-27991     2/2008
JP   2009-260309 A  11/2009
(Continued)

OTHER PUBLICATIONS

Bencher, C., "An assessment of patterning options for 15 nm half-pitch," Apr. 25-27, 2011, IEEE, VLSI Technology, Systems and Applications (VLSI-TSA), 2011 International Symposium on, pp. 1-2.
(Continued)

*Primary Examiner* — Michael Jung
(74) *Attorney, Agent, or Firm* — Finnegan, Henderson, Farabow, Garrett & Dunner, L.L.P.

(57) ABSTRACT

According to one embodiment, a semiconductor device includes interconnects extending from a element formation area to the drawing area, and connected with semiconductor elements in the element formation area and connected with contacts in the drawing area. The interconnects are formed based on a pattern of a $(n+1)^{th}$ second sidewall film matching a pattern of a $n^{th}$ (where n is an integer of 1 or more) first sidewall film on a lateral surface of a sacrificial layer. A first
(Continued)

dimension matching an interconnect width of the interconnects and an interconnects interval in the element formation area is $(k1/2'') \times (\lambda/NA)$ or less when an exposure wavelength of an exposure device is $\lambda$, a numerical aperture of a lens of the exposure device is NA and a process parameter is k1. A second dimension matching an interconnect interval in the drawing area is greater than the first dimension.

10 Claims, 32 Drawing Sheets

Related U.S. Application Data application No. 14/025,372, filed on Sep. 12, 2013, now Pat. No. 9,177,854, which is a division of application No. 13/234,052, filed on Sep. 15, 2011, now abandoned.

(51) Int. Cl.
    *H01L 21/311* (2006.01)
    *H01L 21/3213* (2006.01)
    *H01L 27/06* (2006.01)
    *H01L 27/11524* (2017.01)
    *H01L 27/11551* (2017.01)
    *H01L 27/1157* (2017.01)
    *H01L 27/11578* (2017.01)
    *H01L 21/768* (2006.01)

(52) U.S. Cl.
    CPC .. *H01L 21/31144* (2013.01); *H01L 21/32139* (2013.01); *H01L 21/768* (2013.01); *H01L 21/76816* (2013.01); *H01L 27/0688* (2013.01); *H01L 27/1157* (2013.01); *H01L 27/11524* (2013.01); *H01L 27/11551* (2013.01); *H01L 27/11578* (2013.01)

(56) References Cited

U.S. PATENT DOCUMENTS

| | | | |
|---|---|---|---|
| 7,795,080 | B2 | 9/2010 | Orimoto et al. |
| 8,310,055 | B2 | 11/2012 | Park et al. |
| 2004/0079988 | A1 | 4/2004 | Harari |
| 2006/0046422 | A1 | 3/2006 | Tran et al. |
| 2006/0077702 | A1* | 4/2006 | Sugimae ............ G11O 5/063 365/63 |
| 2007/0141780 | A1* | 6/2007 | Higashitani ........ G11C 16/0483 438/257 |
| 2007/0158688 | A1 | 7/2007 | Caspary et al. |
| 2008/0006869 | A1* | 1/2008 | Kamigaichi ....... G11C 16/0483 257/315 |
| 2009/0010036 | A1* | 1/2009 | Kato ................. G11O 5/025 365/51 |
| 2009/0154240 | A1 | 6/2009 | Park et al. |
| 2009/0263749 | A1 | 10/2009 | Sim et al. |
| 2010/0038795 | A1 | 2/2010 | Aburada et al. |
| 2010/0155959 | A1 | 6/2010 | Park et al. |
| 2010/0244269 | A1 | 9/2010 | Kim |
| 2011/0003469 | A1 | 1/2011 | Kewley et al. |
| 2011/0059403 | A1 | 3/2011 | Sukekawa |
| 2011/0237081 | A1 | 9/2011 | Kewley et al. |
| 2011/0256723 | A1 | 10/2011 | Lee et al. |
| 2011/0316165 | A1 | 12/2011 | You et al. |
| 2012/0049377 | A1 | 3/2012 | Yang et al. |
| 2012/0168955 | A1* | 7/2012 | Chen .................. H01L 21/0337 257/773 |

FOREIGN PATENT DOCUMENTS

JP           2010-511306 A     4/2010
WO    WO 2008/067228 A1   6/2008

OTHER PUBLICATIONS

Bencher, C., et al., "Gridded design rule scaling, taking the CPU toward the 16 nm node," 2009. Optical Microlithography XXII, Proc. of SPIE vol. 7274, pp. 72740G-1 to 72740G-10.

First Office Action, issued by Japanese Patent Office, dated Jul. 2, 2013, in Japanese Patent App. No. 2011-066181 (5 pages with English-language translation).

Written Opinion, issued by Intellectual Property Office of Singapore, dated Aug. 13, 2013, in Singapore Patent App. No. 201106596-8.

* cited by examiner

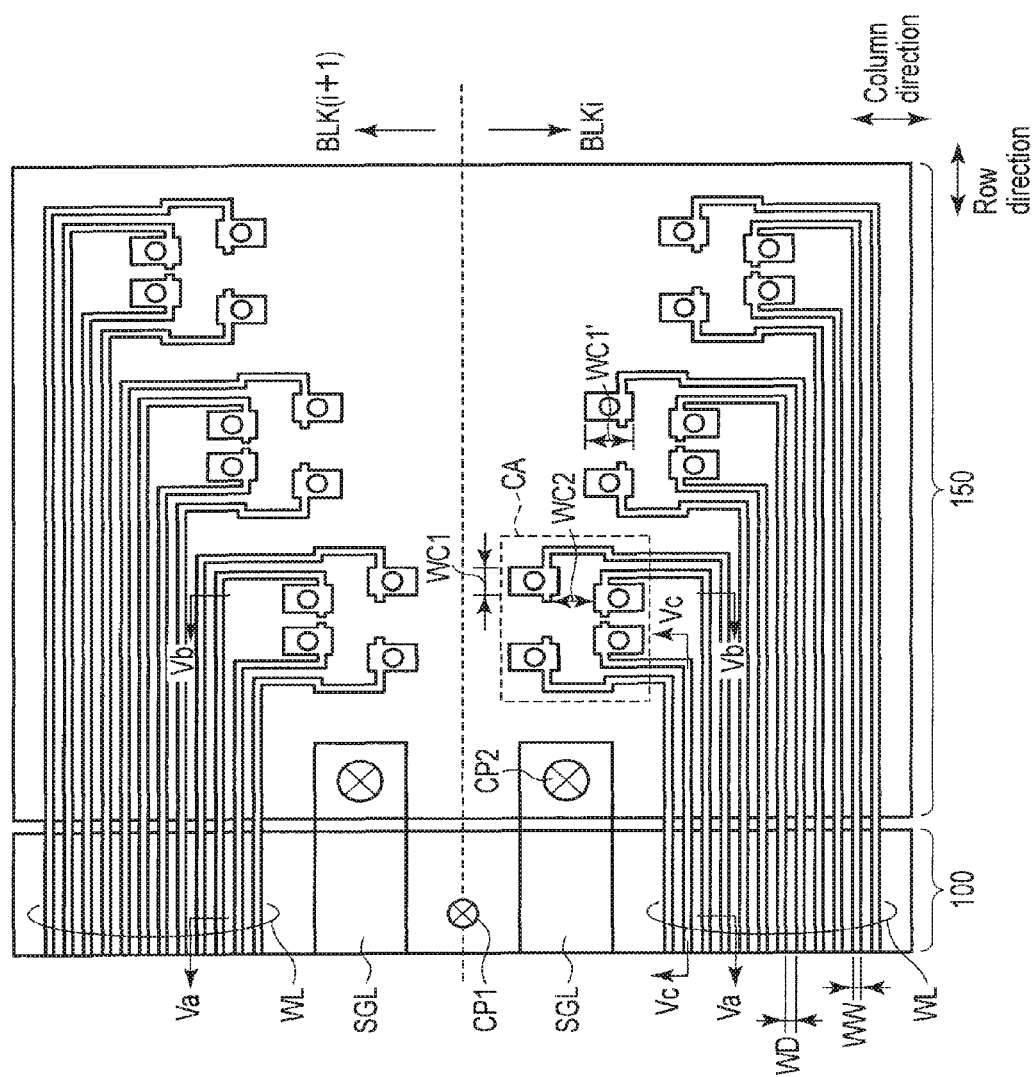
F I G. 4

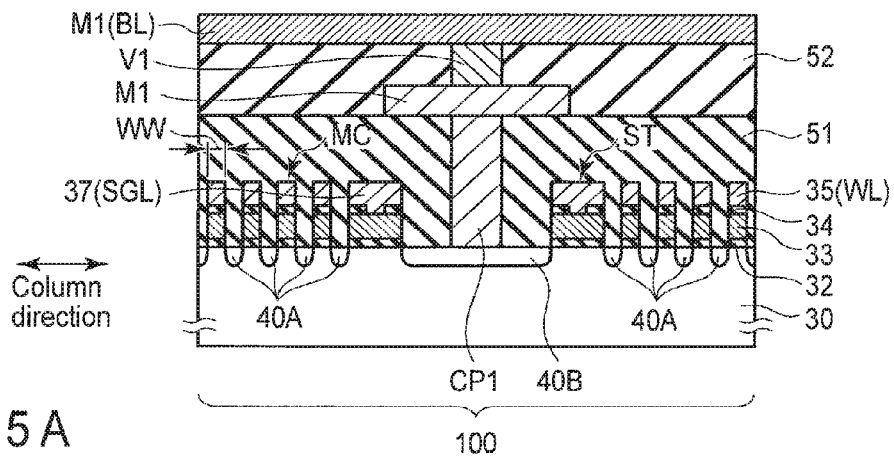
F I G. 5A
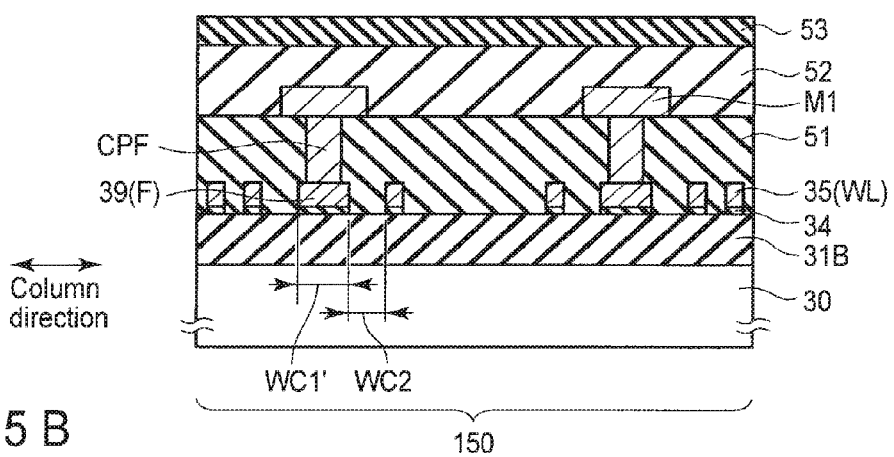
F I G. 5B
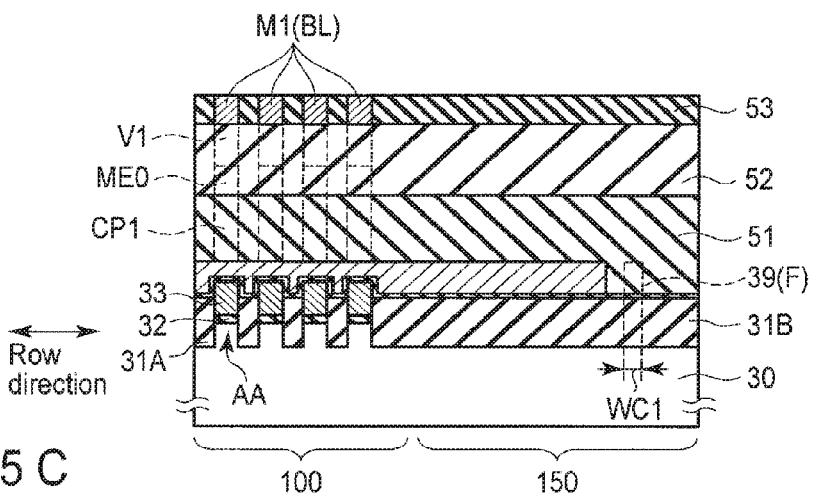
F I G. 5C

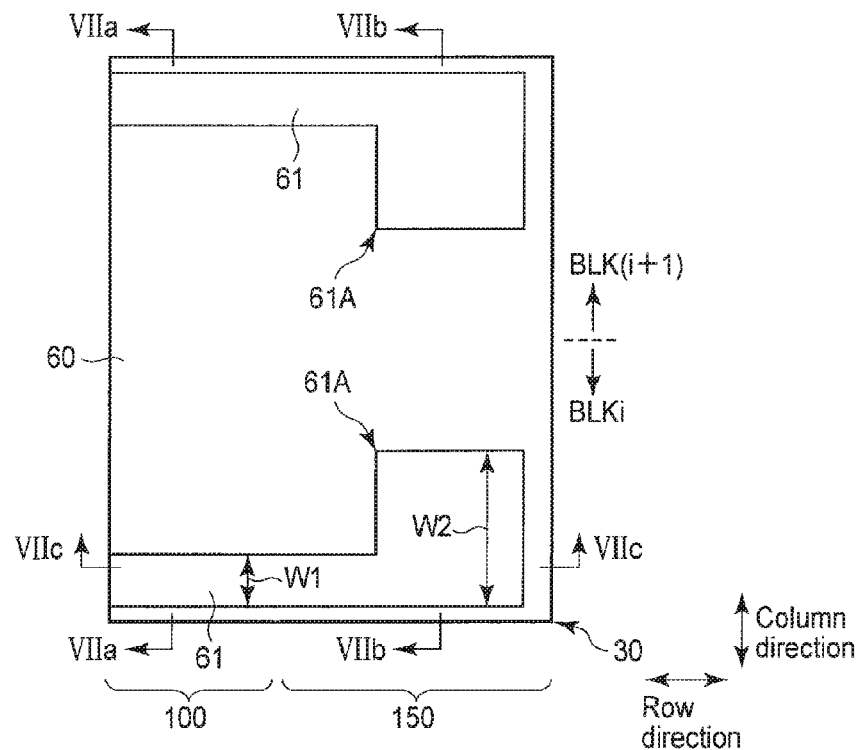
F I G. 6
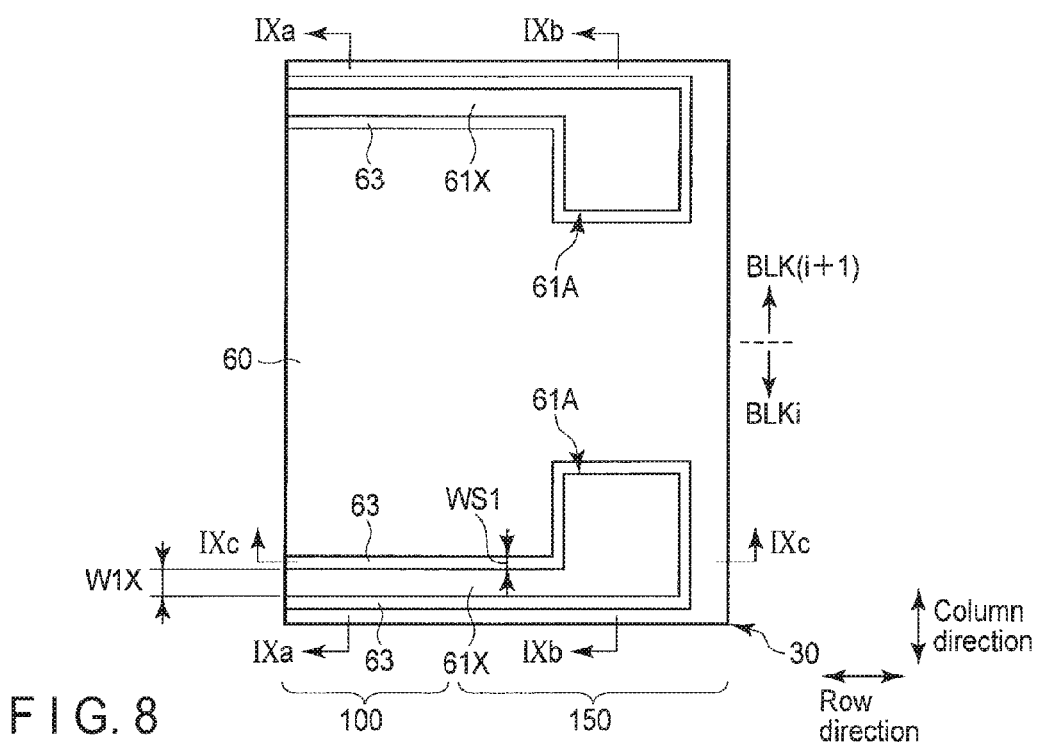
F I G. 8

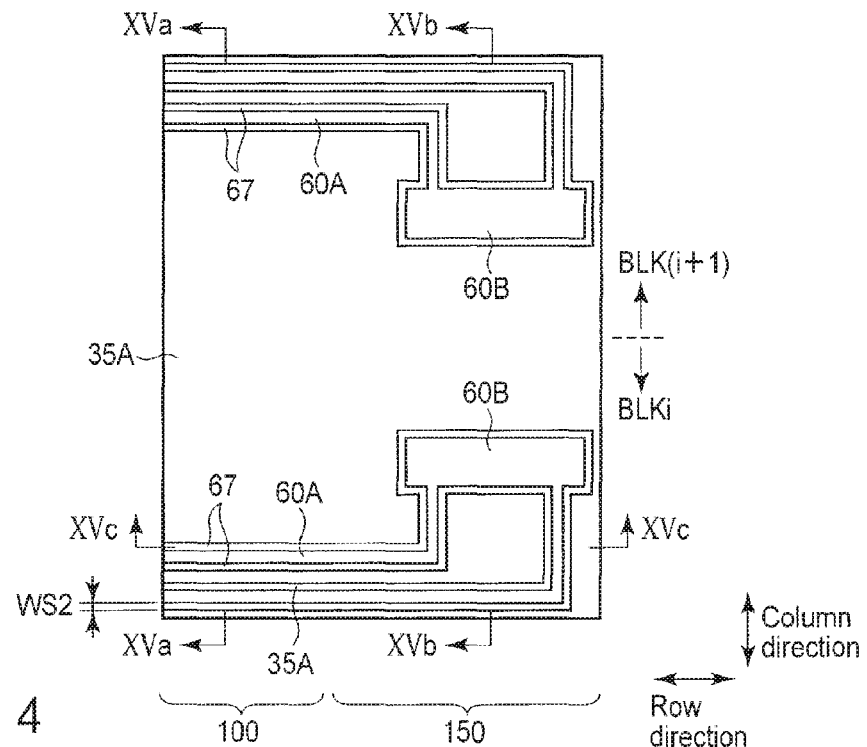
F I G. 14
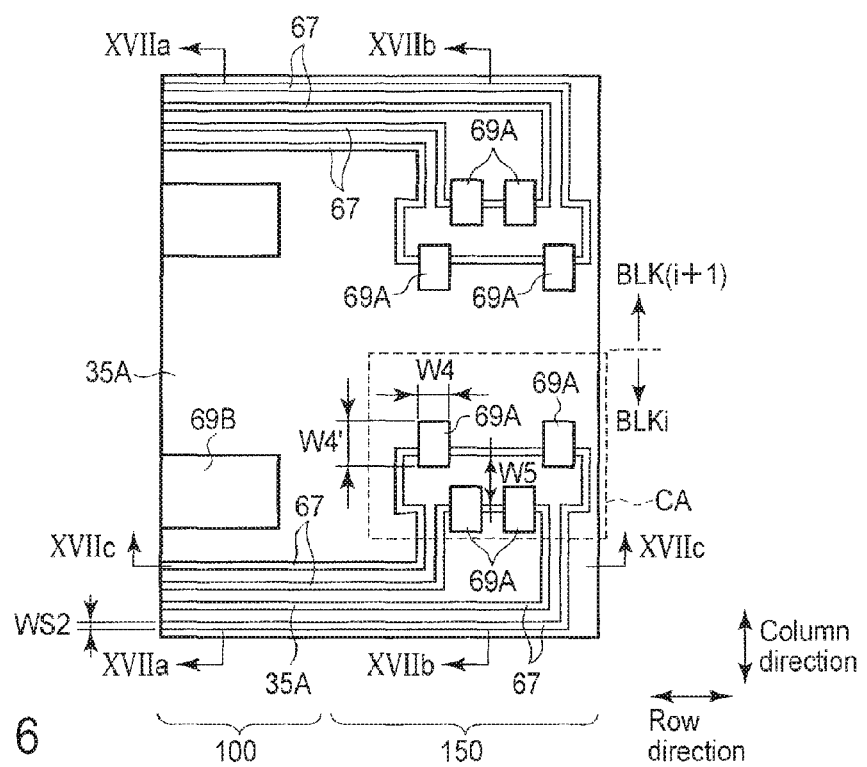
F I G. 16

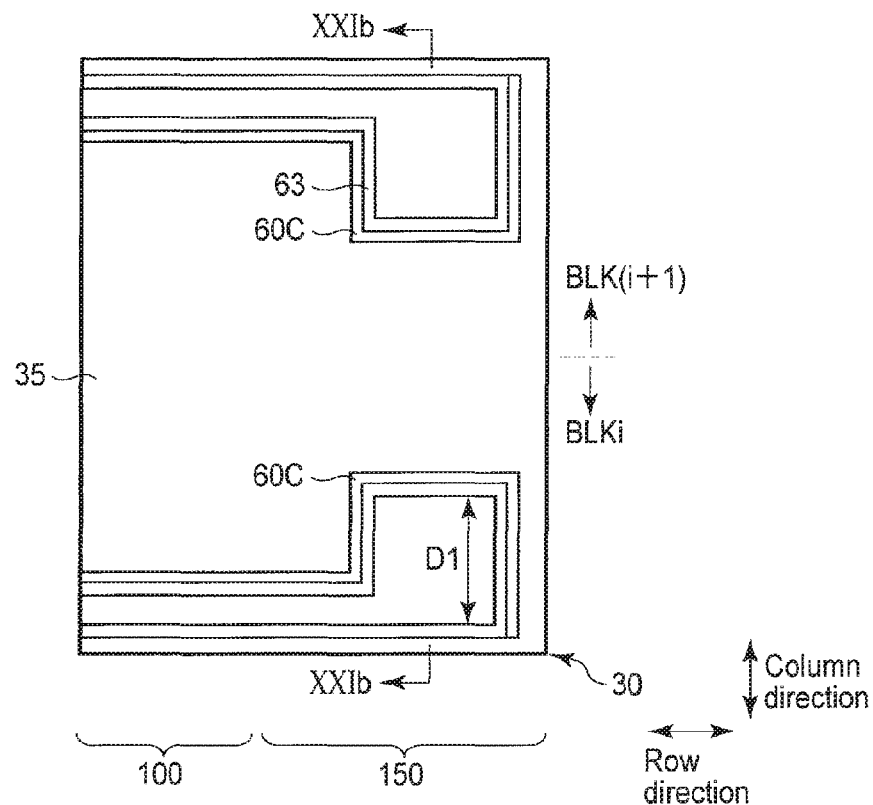
F I G. 21 A
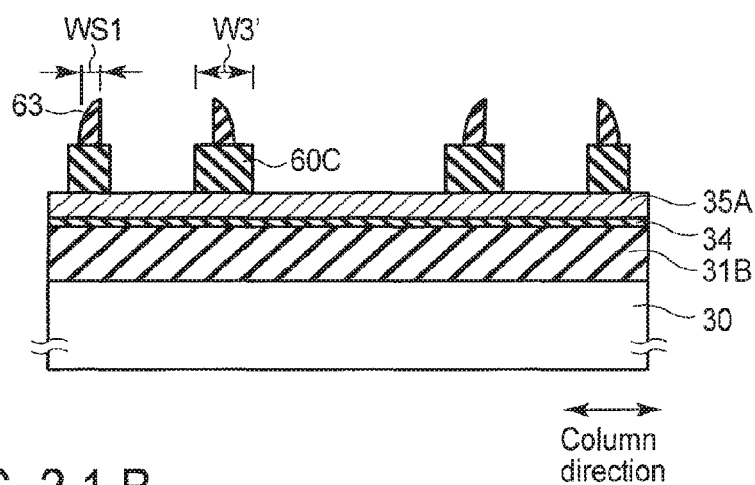
F I G. 21 B

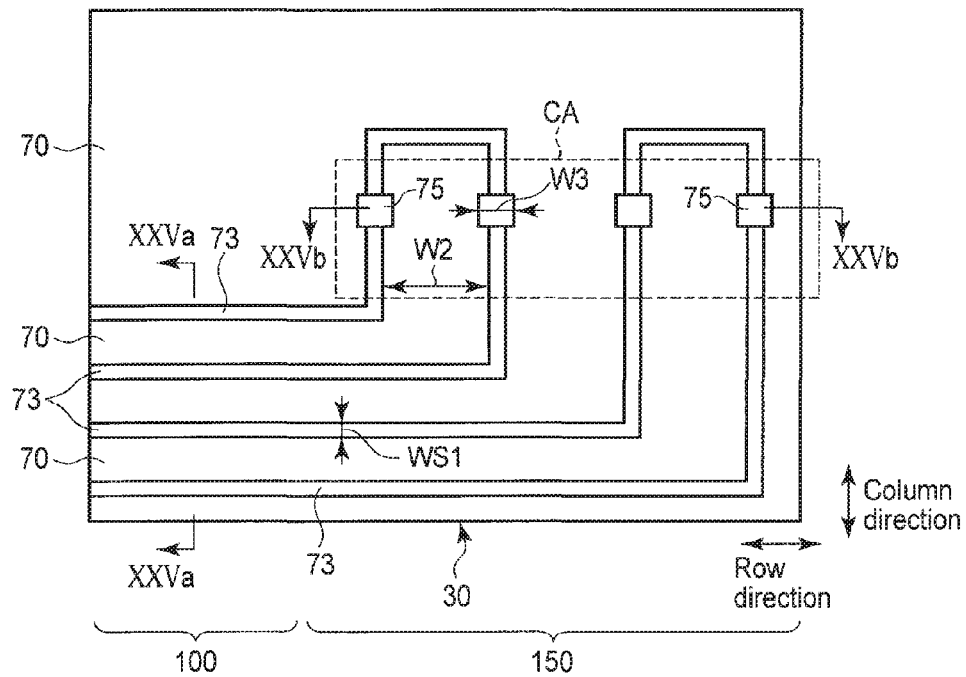
F I G. 24
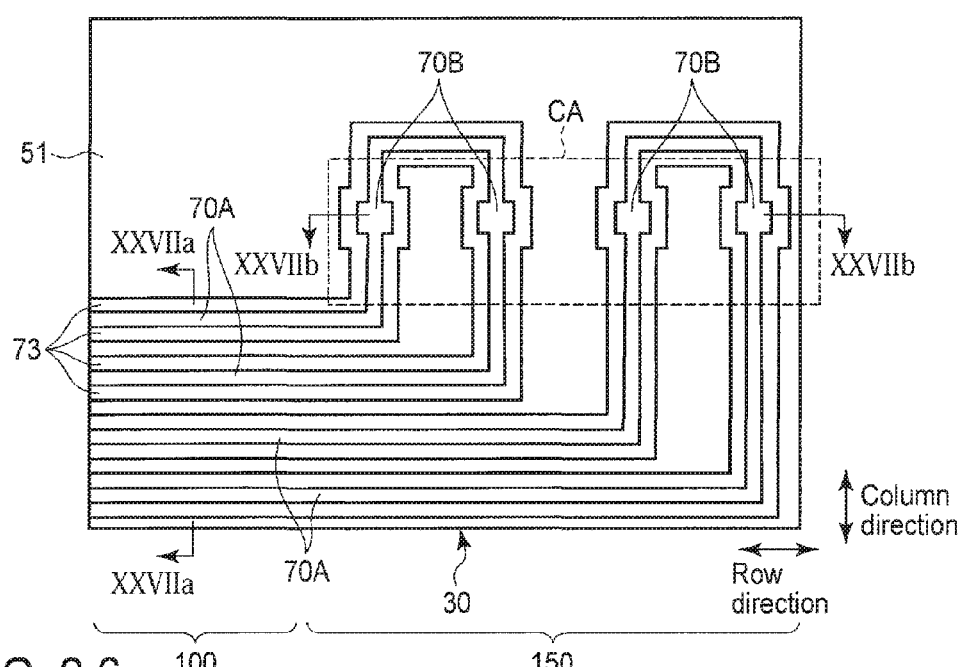
F I G. 26

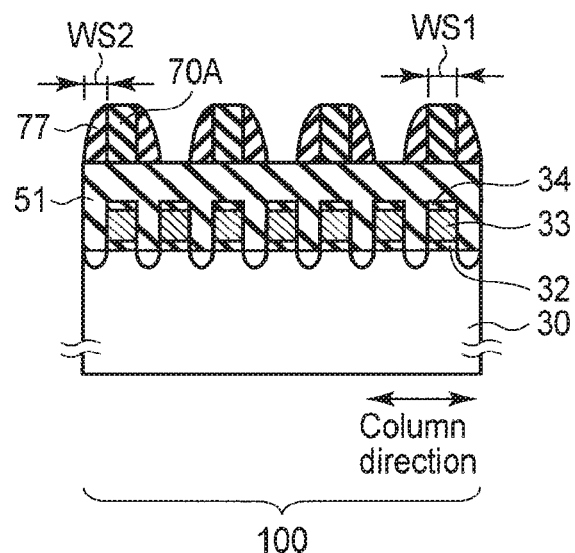
F I G. 27 A
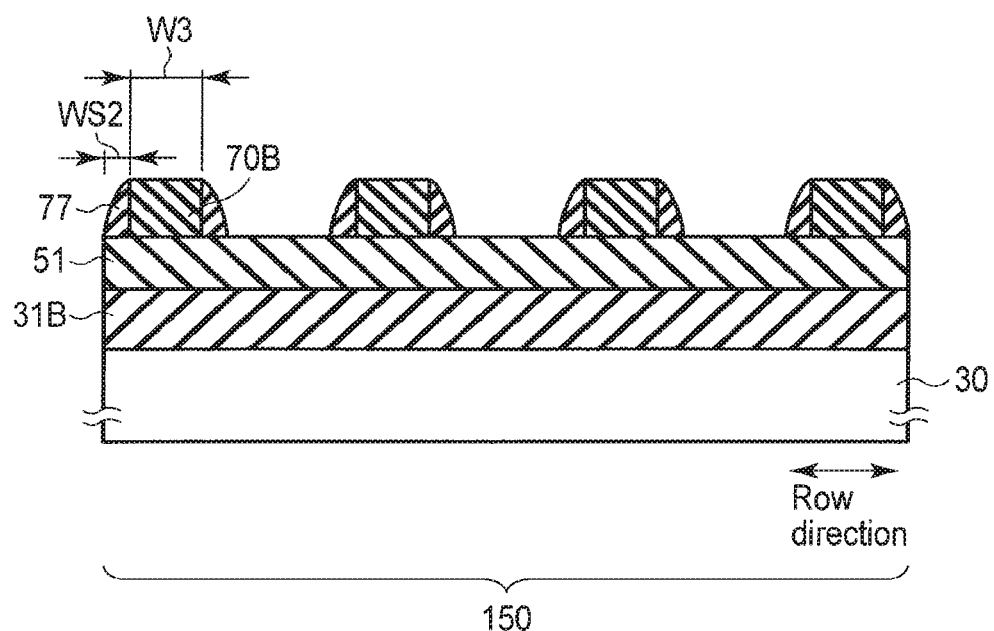
F I G. 27 B

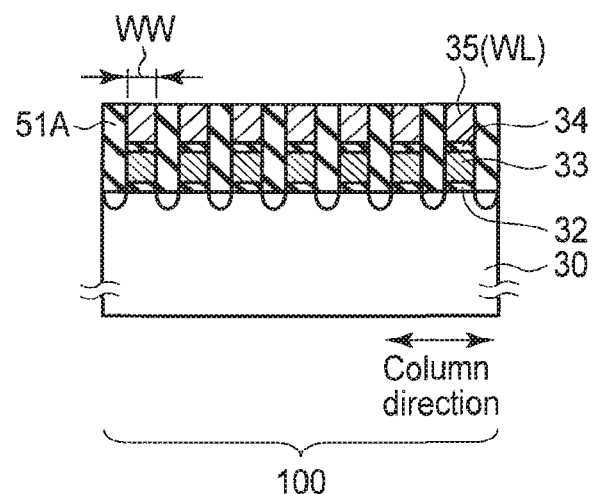
F I G. 3 1 A
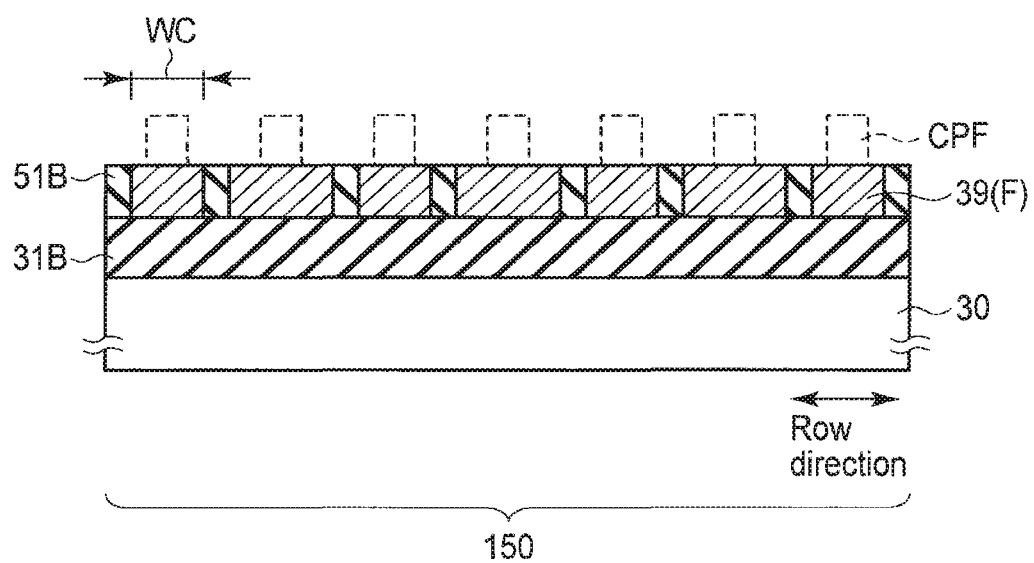
F I G. 3 1 B

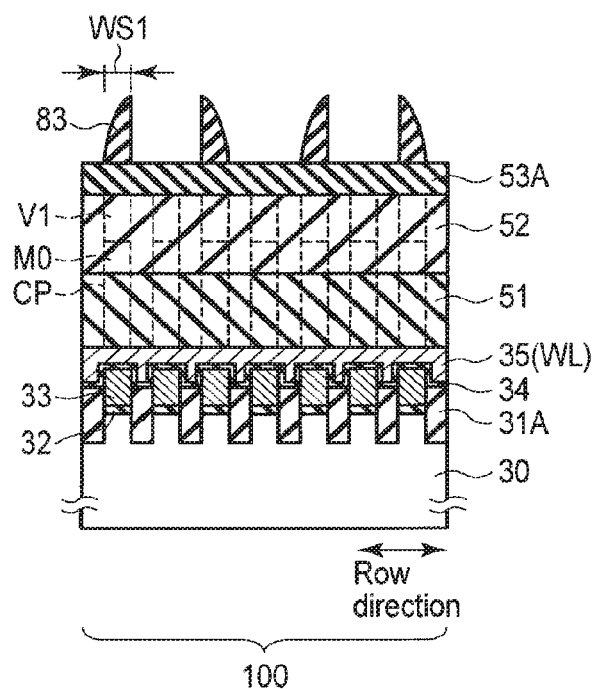
F I G. 32A
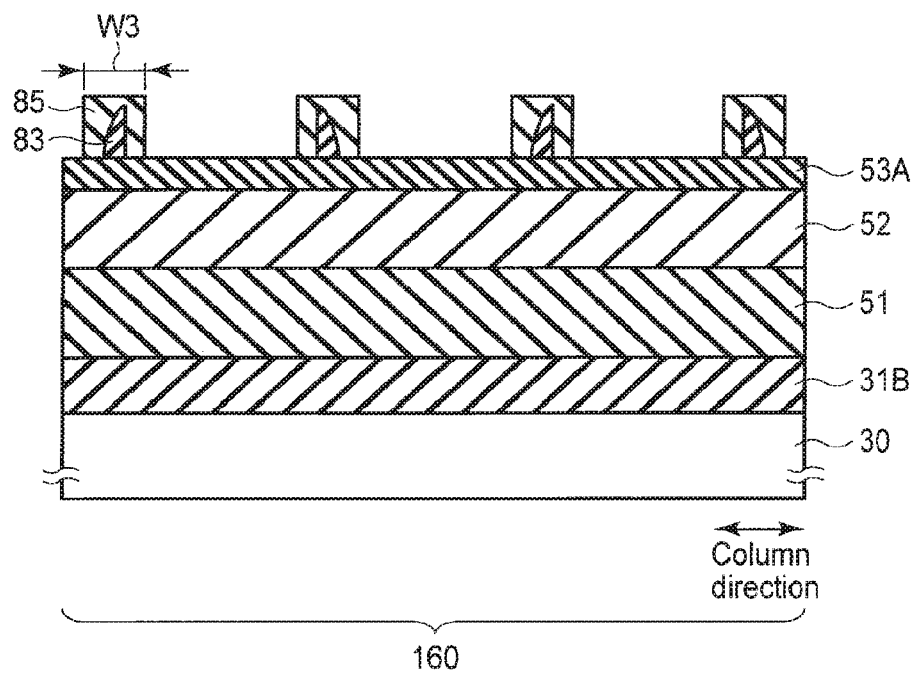
F I G. 32B

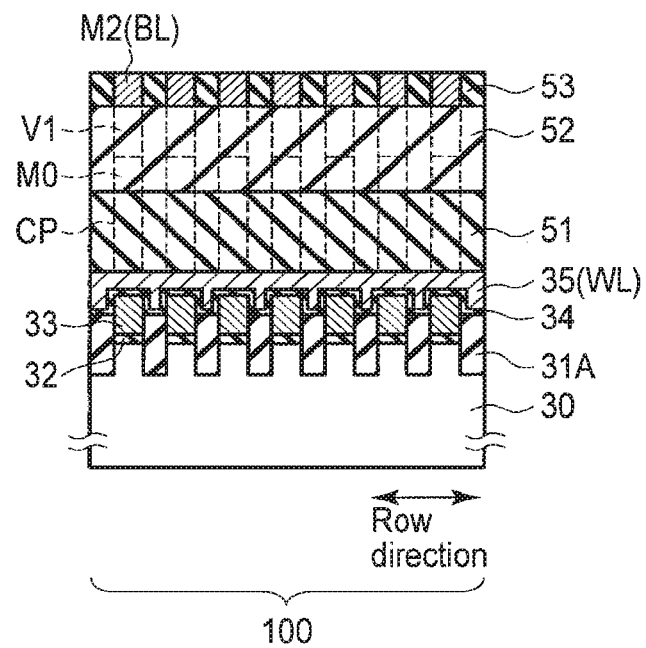
F I G. 34 A
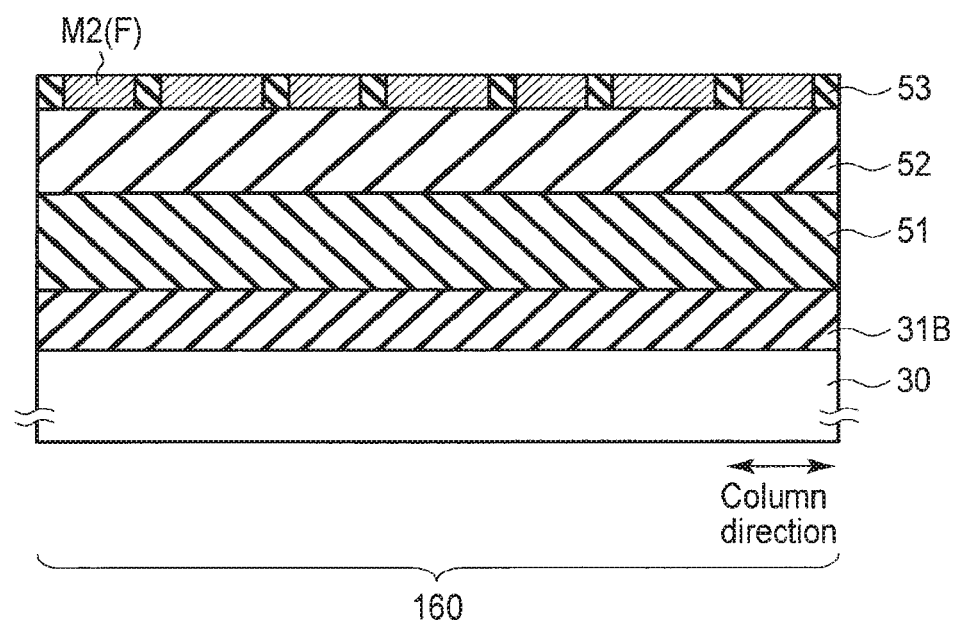
F I G. 34 B

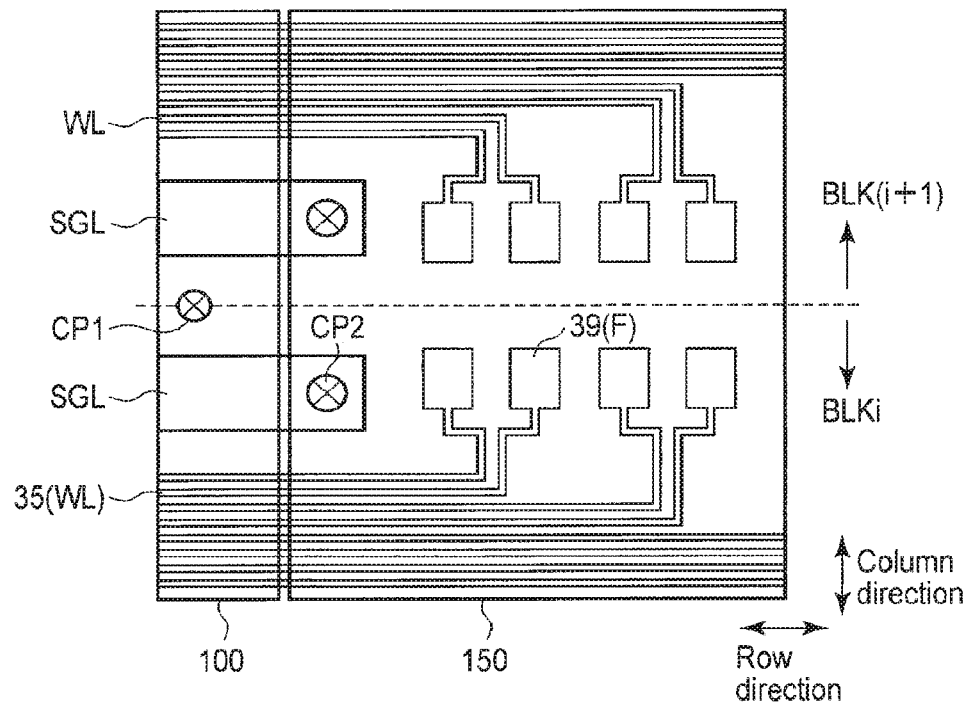
F I G. 35
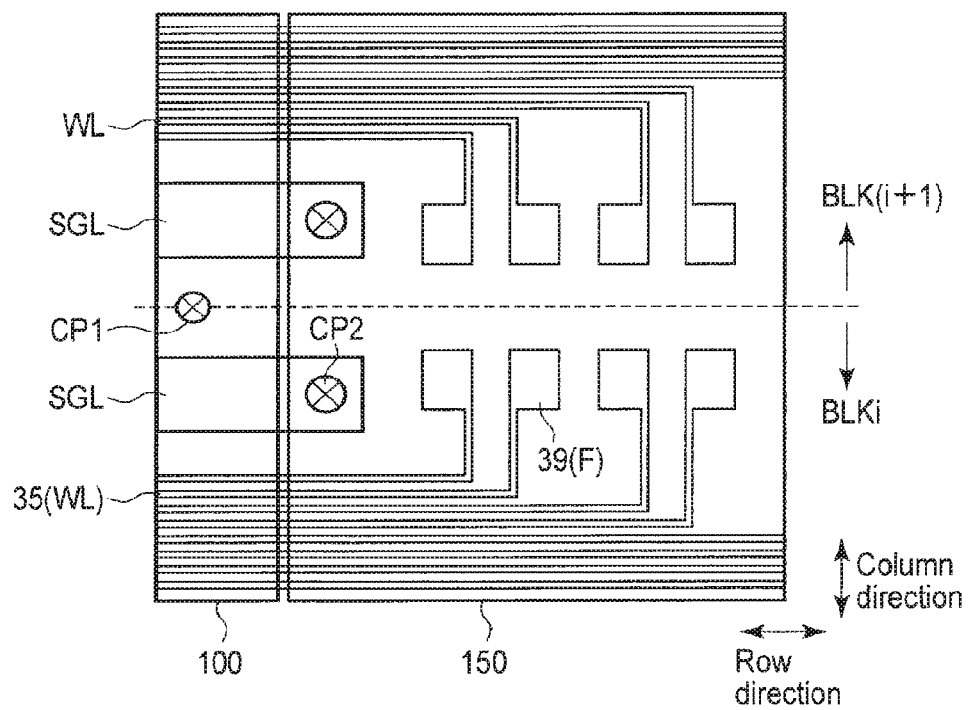
F I G. 36

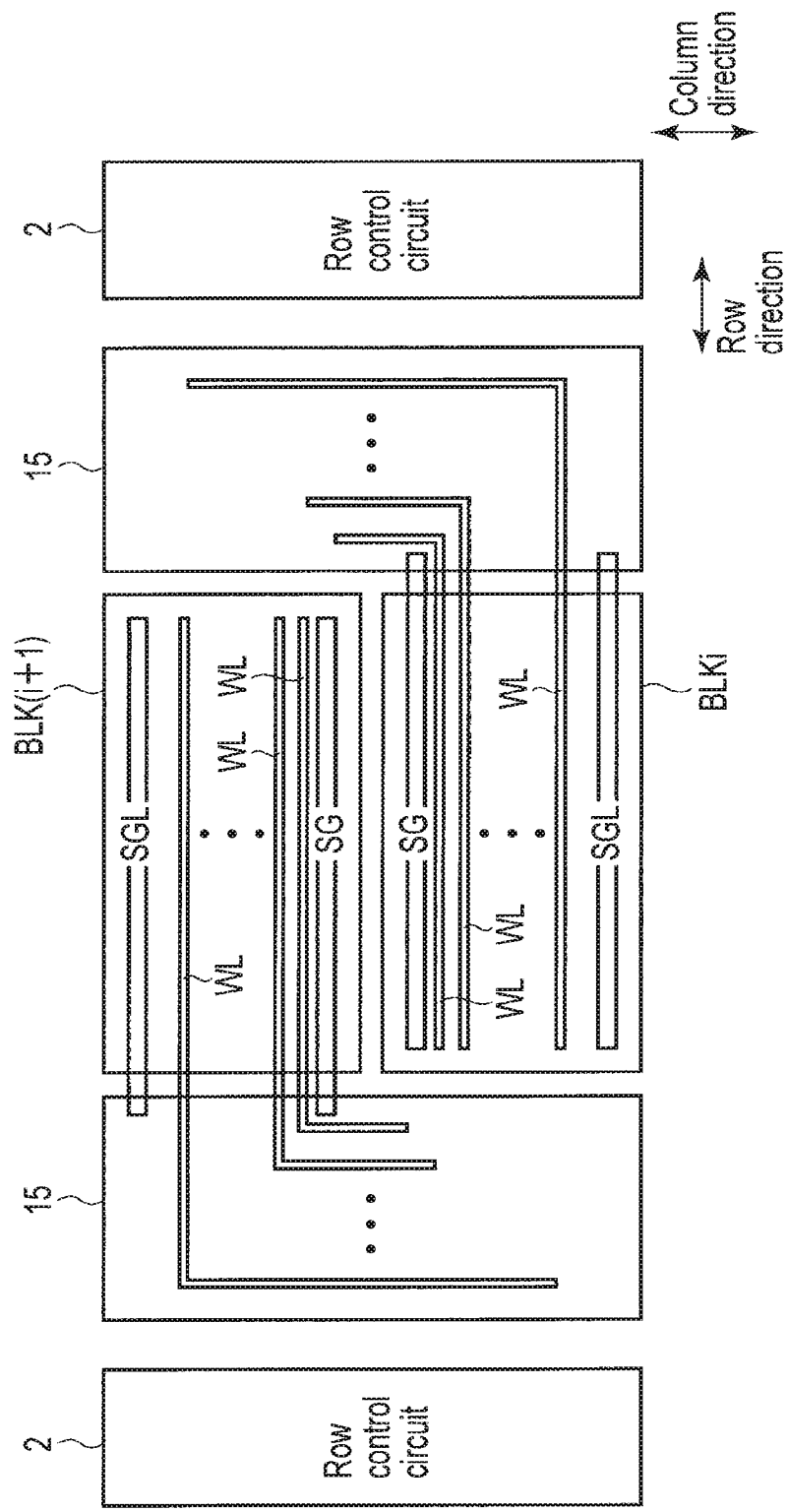
F I G. 37

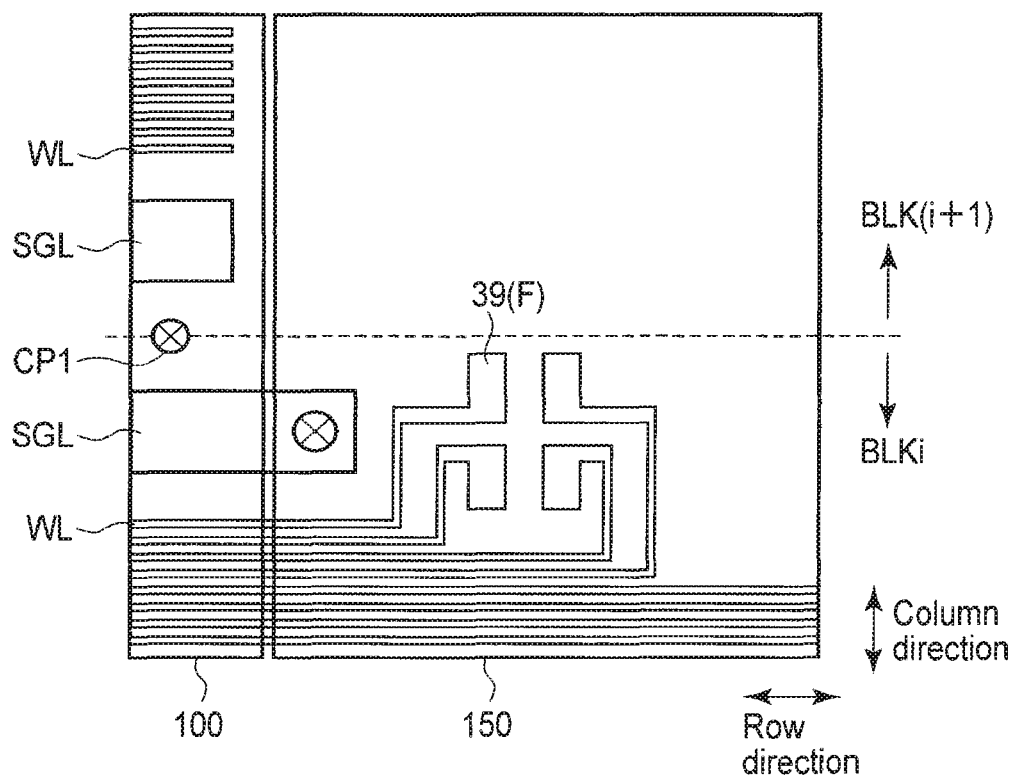
F I G. 40

SEMICONDUCTOR DEVICE HAVING CONTACTS IN DRAWING AREA AND THE CONTACTS CONNECTED TO WORD LINES EXTENDING FROM ELEMENT FORMATION AREA

CROSS-REFERENCE TO RELATED APPLICATIONS

This application is a division of application Ser. No. 14/858,726, filed Sep. 18, 2015, which is a continuation of application Ser. No. 14/025,372, filed Sep. 12, 2013, now U.S. Pat. No. 9,177,854, issued Nov. 3, 2015, which is a division of application Ser. No. 13/234,052, filed Sep. 15, 2011, which is based upon and claims the benefit of priority from prior Japanese Patent Application No. 2011-066181, filed Mar. 24, 2011, the entire contents of all of which are incorporated herein by reference.

FIELD

Embodiments described herein relate generally to a semiconductor device and a method of manufacturing the same.

BACKGROUND

Following miniaturization of semiconductor devices, an interconnect pattern smaller than a limit dimension of the resolution of lithography is demanded to be formed. A sidewall transfer technique is known as one of techniques of forming a fine interconnect pattern.

The sidewall transfer technique can form a pattern having a dimension smaller than the limit dimension (line width or pitch) of the resolution of lithography.

A method is also proposed which forms a pattern having a dimension which is the one fourth of the resolution limit of lithography or less by repeating the sidewall transfer process a plurality of times.

For example, a line-and-space pattern such as a pattern of a memory cell array of a flash memory is formed by the sidewall transfer technique. In an area for connecting peripheral circuits and the memory cell array, a contact pattern is formed to be connected with an interconnect pattern (line pattern) drawn from the memory cell array. The dimension of the contact pattern is preferably greater than the dimension of the interconnect, pattern.

Meanwhile, in a process which is common to a manufacturing process to which the sidewall transfer technique for forming the line-and-space pattern is applied, it is difficult to form a contact pattern having a different dimension from the line pattern.

BRIEF DESCRIPTION OF THE DRAWINGS

FIG. 4 is a plan view illustrating a layout of interconnects in a memory cell array and a drawing area;

FIGS. 5A, 5B and 5C are sectional views illustrating structures of a memory cell array and a drawing area;

FIG. 6 is a plan view illustrating one process of a semiconductor device manufacturing method according to the first embodiment;

FIG. 8 is a plan view illustrating one process of a semiconductor device manufacturing method according to the first embodiment;

FIG. 14 is a plan view illustrating one process of a semiconductor device manufacturing method according to the first embodiment;

FIG. 16 is a plan view illustrating one process of a semiconductor device manufacturing method according to the first embodiment;

FIGS. 17A, 175 and 17C are sectional views illustrating one process of a semiconductor device manufacturing method according to the first embodiment;

FIGS. 21A and 21B are views illustrating one process of a semiconductor device manufacturing method according to the second embodiment;

FIG. 24 is a plan view illustrating one process of a semiconductor device manufacturing method according to the third embodiment;

FIG. 26 is a plan view illustrating one process of a semiconductor device manufacturing method according to the third embodiment;

FIGS. 27A and 27B are sectional views illustrating one process of a semiconductor device manufacturing method according to the third embodiment;

FIGS. 31A and 31B are sectional views illustrating one process of a semiconductor device manufacturing method according to the third embodiment;

FIGS. 32A and 32B are sectional views illustrating one process of a semiconductor device manufacturing method according to the fourth embodiment;

FIGS. 34A and 34B are sectional views illustrating one process of a semiconductor device manufacturing method according to the fourth embodiment;

FIG. 35 is a view illustrating a layout example in a drawing area of a semiconductor device according to an embodiment;

FIG. 36 is a view illustrating a layout example in a drawing area of a semiconductor device according to an embodiment;

FIG. 37 is a view illustrating a layout example in a drawing area of a semiconductor device according to an embodiment;

FIG. 40 is a view illustrating a layout example in a drawing area of a semiconductor device according to an embodiment.

DETAILED DESCRIPTION

Figure 1:
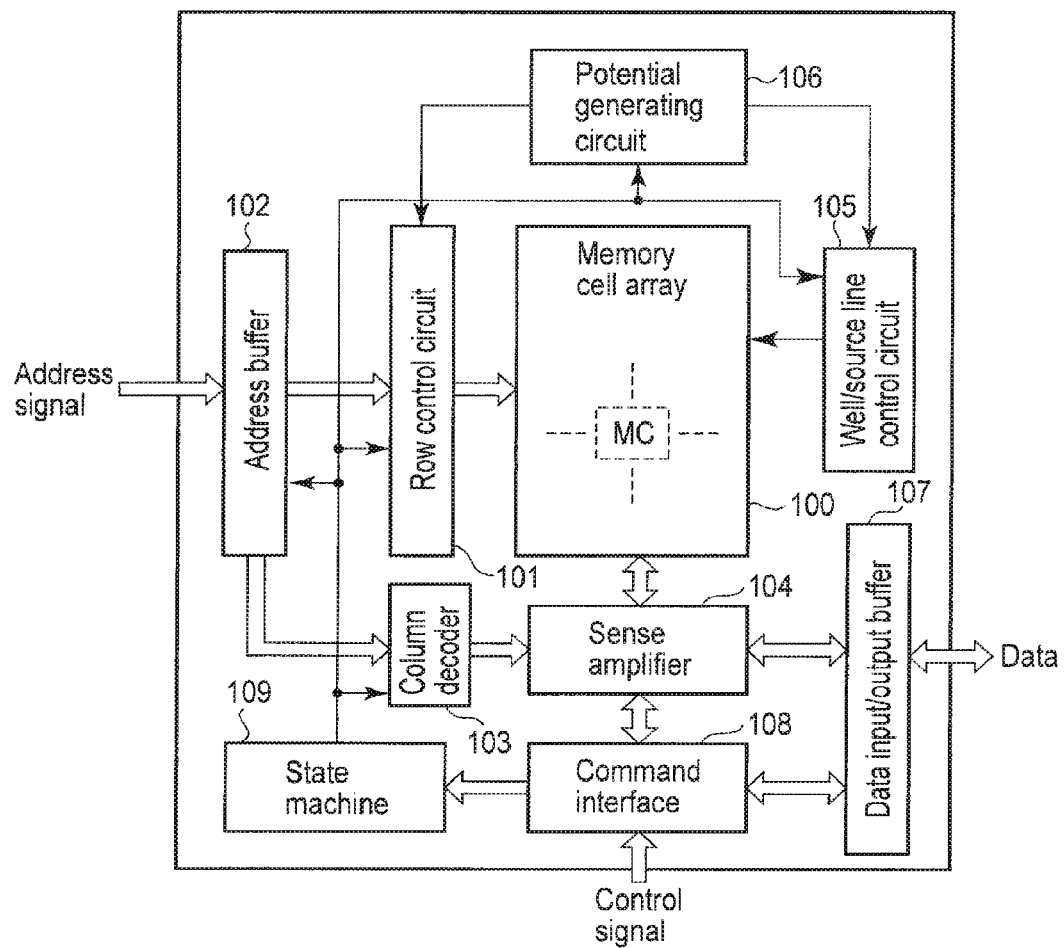
FIG. 1 is a block diagram illustrating a configuration example of a semiconductor device.

Hereinafter, embodiments will be described in detail with reference to the drawings. In the following description, elements having the same functions and configurations will be assigned the same reference numerals, and overlapping explanation will be made where necessary.

In general, according to one embodiment, a semiconductor device includes a semiconductor substrate which includes an element formation area and a drawing area; a plurality of semiconductor elements which are provided in the element formation area; a plurality of interconnects which extend from the element formation area to the drawing area, and which are connected with the semiconductor elements; and a plurality of contacts which are provided in the drawing area and are connected respectively with the plurality of interconnects. The interconnects are formed based on a pattern of a $(n+1)^{th}$ second sidewall film matching pattern of a $n^{th}$ (where n is an integer of 1 or more) first sidewall film on a lateral surface of a sacrificial layer. A first dimension matching an interconnect width of the interconnects and an interval between the interconnects adjacent in the element formation area is smaller than a limit dimension of resolution of lithography. The first dimension is $(k1/2^n) \times (\lambda/NA)$ or less when an exposure wavelength of an exposure device is $\lambda$, a numerical aperture of a lens of the exposure device is NA and a process parameter is k1, and a second dimension matching an interval between the interconnects adjacent in the drawing area is greater than the first dimension.

EMBODIMENT

(1) First Embodiment

Hereinafter, a semiconductor device and a manufacturing method of the semiconductor device according to the first embodiment will be described with reference to FIGS. 1 to 18.

(a) Entire Configuration Example

An entire configuration example of the semiconductor device according to the first embodiment will be described using FIGS. 1 and 2.

Figure 2:
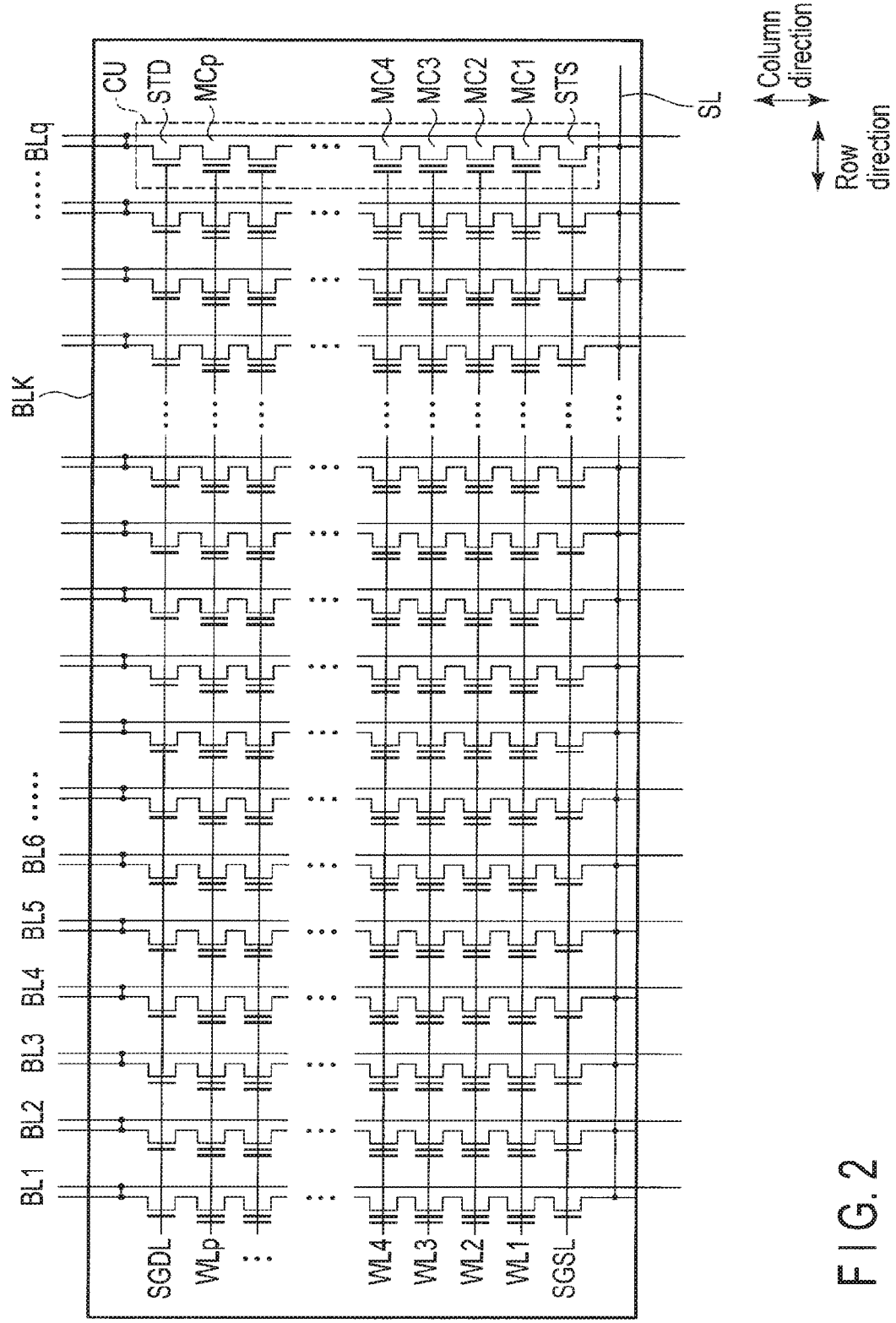
FIG. 2 is an equivalent circuit diagram illustrating a configuration example of a semiconductor device.

FIG. 1 is a block diagram illustrating a main part of a semiconductor device according to the present embodiment.

The semiconductor device according to the present embodiment is, for example, a semiconductor memory. However, the present embodiment is by no means limited to a semiconductor memory, and is also applied to a semiconductor device which includes an interconnect pattern formed by repeating a sidewall transfer process (sidewall formation process) a plurality of times.

A memory cell array 100 has a plurality of memory cells (memory elements) MC. The memory cell array 100 stores data from the outside.

A configuration of the memory cell array 100 will be described with reference to FIG. 2 using a NAND type flash memory as an example. FIG. 2 is an equivalent circuit diagram of one block in the memory cell array.

One block BLK has a plurality of memory cell units CU aligned in an x direction (first direction). In one block BLK, for example, q memory cell units CU are provided.

One memory cell unit CU includes a memory cell string formed with a plurality of (for example, p) memory cells MC1 to MCp, a first select transistor STS (hereinafter, "source side select transistor") connected to one end of the memory cell string, and a second select transistor STD (hereinafter, "drain side select transistor") connected to the other end of the memory cell string. In the memory cell string, current paths of the memory cells MC1 to MCp are connected in series along a column direction (second direction).

A source line SL is connected to one end (source side) of the memory cell unit CU, more specifically, to one end of the current path of the source side select transistor STS. Further, a bit line BL is connected to the other end (drain side) of the memory cell unit MU, that is, to one end of the current path of the drain side select transistor STD.

In addition, the number of memory cells forming one memory cell unit CU only needs to be two or more, and may be, for example, sixteen, thirty two, sixty four or more. Hereinafter, when the memory cells MC1 to MCp are not distinguished, these are represented as "memory cells MC". Further, when the source side and drain side select transistors STD and STS are not distinguished, these are represented as "select transistors ST".

The memory cell MC is a field-effect transistor adopting a stack gate structure having a charge storage layer which can hold the charge (for example, a floating gate electrode or an insulating film including a trap level). The memory cell changes a threshold of the transistor according to the amount of charge held in the charge storage layer. In the memory cell, data to be stored and a threshold voltage are associated.

Two memory cells MC adjacent in the column direction are connected with a source/drain. By this means, the current paths of the memory cells MC are connected in series, thereby forming the memory cell string.

The drain of the source side select transistor STS is connected to the source of the memory cell MC1. The source of the source side select transistor STS is connected to the source line SL. The source of the drain side select transistor STD is connected to the drain of the memory cell MCp. The drain of the drain side select transistor STD is connected to bit lines BL1 to BLq. The number of bit lines BL1 to BLq is the same as the number of memory cell units CU in the block BLK.

The word lines WL1 to WLp extend in a row direction, and each of the word lines WL1 to WLp is commonly connected to the gates of a plurality of memory cells MC aligned along the row direction. In one memory cell unit CU, the number of word lines is the same as the number of (p) memory cells in one memory cell string.

The drain side select gate line SGDL extends in the row direction, and is commonly connected to the gates of a plurality of drain side select transistors STD aligned along the row direction. The source side select gate line SGSL extends in the row direction, and is commonly connected to the gates of a plurality of source side select transistors STS aligned along the row direction.

Hereinafter, when each of the word lines WL1 to WLp is not distinguished, this is represented as a "word line WL", and, when each of the bit lines BL1 to BLq is not distinguished, this is represented as a "bit line BL". Further, when the source side and drain side select gate lines SGSL and SGDL are not distinguished, these are represented as "select gate lines SGL".

A row control circuit (for example, a word line driver) 101 controls rows of the memory cell array 100. The row control circuit 101 drives the word lines WL based on an address signal from an address buffer 102 to access a selected memory cell.

A column decoder 103 selects a column of the memory cell array 100 based on the address signal from the address buffer 102, and drives the selected bit line BL.

A sense amplifier 104 detects and amplifies fluctuation of a potential of the bit line BL. Further, the sense amplifier 104 temporarily holds data which is read from the memory cell array 100, and data which is written in the memory cell array 100.

A well/source line potential control circuit 105 controls the potential of a well region and the potentials of the source lines SL in the memory cell array 100.

A potential generating circuit 106 generates voltages to be applied to the word lines WL when data is written (programmed), is read or erased. Further, the potential generating circuit 106 also generates potentials to be applied to, for example, the select gate line SGL, source line SL and a well region in the semiconductor substrate. The potential generated by the potential generating circuit 106 is input to the row control circuit 101, and is applied to the selected word line and non-selected word line WL and select gate line SGL, respectively.

A data input/output buffer 107 functions as an interface of inputting and outputting data. The data input/output buffer 107 temporarily holds the data input from the outside. The data input/output buffer 107 temporarily holds data output from the memory cell array 1, and outputs the data which is held, to the outside at a predetermined timing.

A command interface 108 decides whether or not data input to the data input/output buffer 7 is command data (command signal). When data input to the data input/output buffer 107 includes command data, the command interface 108 transfers command data to the state machine 109.

The state machine 109 controls the operation of each circuit inside the flash memory according to a request from the outside.

(a) Structure

An example of an interconnect layout of a semiconductor device (for example, flash memory) according to the present embodiment will be described using FIGS. 3, 4, 5A, 5B and 5C.

Figure 3:
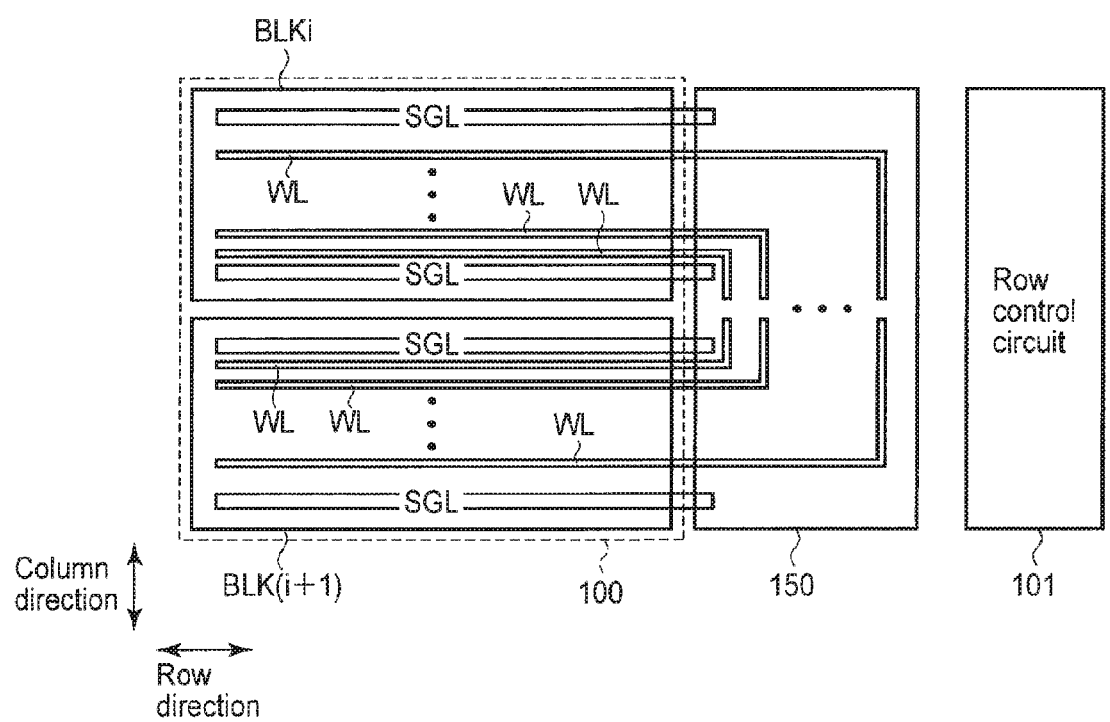
FIG. 3 is a plan view schematically illustrating a layout of a memory cell array and a drawing area.

FIG. 3 is a view schematically illustrating a positional relationship of the memory cell array 100, row control circuit 101 and drawing area 150 arranged around the memory cell array 100. The memory cell array 100 has a plurality of blocks arranged in a column direction. FIG. 3 illustrates two blocks BLKi and BLK(i+1) for ease of description. In addition, the number of blocks in the memory cell array 100 is not limited to two.

A plurality of word lines WL are provided respectively in blocks BLKi and BLK(i+1). The two select gate lines SGL are arranged respectively at one end and the other end in the column direction in each of blocks BLKi and BLK(i+1) to sandwich the word lines WL in each of blocks BLKi and BLK(i+1). In each of blocks BLKi and BLK(i+1), one of the two select gate lines SGL is the select gate line SGL of the source line side select transistor, and the other one is the select gate line SGL of the bit line side select transistor.

With the example illustrated in FIG. 3, the row control circuit 101 is arranged at one end (one side) of the memory cell array 100 in the row direction.

The interconnect width and interconnect pitch (interconnect interval) of the memory cell array 100 are different from the interconnect width and interconnect pitch of the peripheral circuits such as the row control circuit 101. Hence, as illustrated in FIG. 3, a drawing area (also referred to as "hook-up area") 150 for converting the interconnect width and interconnect pitch is arranged between the memory cell array 100 and row control circuit 101.

With the example illustrated in FIG. 3, as a whole, the word lines WL multiply surround the two select gate lines SGL which are provided at the boundary side of the two blocks BLKi and BLK(i+1). In the memory cell array 100, a plurality of word lines WL extend in the row direction. In the drawing area 150, the ends of a plurality of word lines WL are bent toward the boundary side of blocks BLKi and BLK(i+1) (in the column direction and downward or upward in FIG. 3). Hereinafter, this interconnect pattern will be referred to as an "L-shape".

Further, as illustrated in FIG. 3, a plurality of word lines WL are separated from each other at the end of the memory cell array 100 or in the drawing area 150, thereby securing independence of a plurality of word lines WL.

In the drawing area 150, contact plugs (contact holes) are connected to the word lines WL between, for example, portions at which the word lines WL are bent and the front ends of the word lines WL. The contact plugs are arranged on contacts provided in the drawing area 150. The contacts are connected to the word lines WL in the drawing area 150. The contact is made of the same member (material) as the word line WL.

Hereinafter, the contact connected to the word line (interconnect) will also be referred to as a "fringe".

In addition, although an area (hereinafter "dummy cell area") including dummy cells which do not function as memory cells is provided between the memory cell array 100 and drawing area 150, the dummy cell area will not be illustrated with the present embodiment.

FIG. 4 is a plan view extracting the vicinity of the boundary between the two blocks BLKi and BLK(i+1) in FIG. 3. FIGS. 5A, 5B and 5C are views for describing a cross-sectional structure of the memory cell array 100 and drawing area 150. FIG. 5A illustrates a cross-sectional structure along line Va-Va in FIG. 4. FIG. 5B is a cross-sectional structure along line Vb-Vb in FIG. 4. FIG. 5C illustrates a cross-sectional structure along line Vc-Vc in FIG. 4.

As illustrated in FIGS. 4 to 5C, the memory cells MC and select transistors ST are arranged on the semiconductor substrate 30 in which the well region (not illustrated) is formed.

As illustrated in FIGS. 5A and 5C, the memory cells MC are arranged in the memory cell array 100. With the present embodiment, the memory cell MC is a field-effect transistor adopting a stack gate structure having a charge storage layer. The gate of the memory cell MC includes charge storage layers 33 formed on gate insulating films (for example, tunnel insulating films) 32, insulators (referred to as "intergate insulating films" or "block insulating films") 34 formed on the charge storage layers 33 and control gate electrodes 35 formed on the insulators 34. The charge storage layer 33 is made of, for example, conductive silicon. The charge storage layer 33 made of silicon is referred to as a "floating gate electrode 33". In addition, the charge storage layer 33 may be made of the insulating film (for example, silicon nitride) including the trap level with respect to the electron.

As illustrated in FIG. 5C, isolation insulating films 31A of the STI structure are embedded in the semiconductor substrate 30 in the memory cell array 100. By this means, active areas AA are defined in the semiconductor substrate 30. The active area AA extends in the column direction. A plurality of floating gate electrodes 33 aligned in the row direction are separated per memory cell by the isolation insulating films 31.

The control gate electrode 35 extends in the row direction, and is commonly used for a plurality of memory cells aligned in the row direction. The control gate electrode 35 is used as the word line WL.

A gate electrode 37 of the select transistor ST adopts a structure similar to the stack gate structure of the memory cell MC. The gate electrode 37 of the select transistor includes a first electrode layer formed at the same time when the charge storage layers 33 are formed, an insulator formed at the same time when the intergate insulating films are formed and a second electrode layer formed at the same time when the control gate electrodes 35 are formed. In the select transistor ST, the first electrode layer and second electrode layer are connected through an opening formed in the insulator. The two connected electrode layers form the select gate line SGL. A plurality of first electrode layers aligned in the row direction are electrically separated by the isolation insulating films 31A similar to the floating gate electrodes 33. Similar to the control gate electrodes 35, the second electrode layer extends in the row direction, and is commonly used for a plurality of select transistors aligned in the row direction.

The memory cells MC and select transistors ST are, for example, connected in series in the column direction by diffusion layers 40A formed in the semiconductor substrate 30. The two adjacent select transistors ST share a diffusion layer 40B formed in the semiconductor substrate 30. The diffusion layers 40A and 40B are used as the source and drain of each transistor MC and ST. A plurality of memory cells MC connected in series by the diffusion layers 40A form a memory cell unit.

A first interlayer insulating film 51 is provided on the semiconductor substrate 30. Interlayer insulating film 51 covers gate electrodes of the memory cells MC and gate electrodes of the select transistors ST. In the contact hole formed in interlayer insulating film 51, a contact plug CP1 is embedded. Contact plug CP1 is connected to the diffusion layer 40B shared by the select transistors ST. The diffusion layer 40B is connected to a first interconnect layer (metal layer) M0 on interlayer insulating film 51 through contact plug CP1.

A second interlayer insulating film 52 is layered on the first interlayer insulating film 51.

When the diffusion layer 40B is shared by the drain side select transistors STD, a second interconnect layer (metal layer) M1 which is the bit line BL is connected to the diffusion layer 40B through a via plug V1 in interlayer insulating film 52, the first interconnect layer M0 and contact plug CP1. The second interconnect layer M1 which is the bit line BL extends in the column direction. Contact plug CP1 connected to each bit line BL is electrically separated per memory cell unit aligned in the row direction.

In addition, when the diffusion layer 40B is shared by the source side select transistors STS, the source line SL for which the first interconnect layer M0 is used is connected to the diffusion layer 40B.

As illustrated in FIGS. 5B and 5C, the control gate electrodes 35 which are the word lines WL extend from the inside of the memory cell array 100 to the inside of the drawing area 150. Further, to secure the independence of the word lines WL, the word lines are separated inside the drawing area 150. The portions at which the word lines are separated are by no means limited to the portions illustrated in FIG. 4.

The word lines WL are connected to fringes 39(F) in the drawing area 150. A contact plug CPF is provided on a fringe 39, thereby electrically connecting the fringe 39 and contact plug CPF. To connect the control gate electrodes (word lines) 35 (WL) and row control circuit (for example, word line driver), for example, the first interconnect layer M0 provided in the drawing area 150 is used. Interconnect layer M0 extending from the row control circuit 101 is connected to contact plug CPF on the fringe 39. In addition, by further using interconnect layer M1 positioned at the same interconnect level as the bit lines BL, the word lines 35 may be connected to the row control circuit 101.

An area in which the fringe 39 is provided in the drawing area 150 is also referred to as a "contact area CA".

By adjusting bending positions of the word lines WL drawn in the drawing area 150, the fringes 39 and contact plugs CPF allow free adjustment of positions and sizes thereof and pitches between fringes and between contact plugs two-dimensionally (in the row direction and column direction). For example, a layout of a plurality of contact plugs CPF can be shifted and set in the row direction and column direction per word line WL. Consequently, it is possible to simplify the layout of the interconnect layers for connecting the word lines WL and row control circuit 101.

Further, the gate electrodes 37 of select transistors which are the select gate lines SGL extend from the inside of the memory cell array 100 to the inside of the drawing area 150. The interconnect width of the select gate lines SGL is wider than, for example, an interconnect width WW of the word lines WL. Hence, the select gate line SGL is not connected with the fringe, and a contact plug CP2 is provided on the select gate SGL inside the drawing area 150.

As illustrated in FIG. 5C, an isolation insulating film 31B is provided in, for example, the semiconductor substrate 30 inside the drawing area 150. The isolation insulating film 31B is formed in the entire drawing area 150. Inside the drawing area 150, the word lines WL and fringes 39 are provided on the isolation insulating film 31B.

The word lines WL have a line-and-space pattern in the memory cell array 100. The line-and-space pattern has a pattern in which a line pattern (for example, a conductor pattern and, here, a word line pattern) and a space pattern (for example, an insulator pattern) between line patterns are aligned at a predetermined cycle in a direction crossing the direction in which the interconnect pattern extends. For example, a line width WD of the space pattern, that is, an interconnect interval WD between the interconnect lines, is preferably nearly the same as the interconnect width WW of the word lines WL. Meanwhile, it naturally follows that the interconnect interval WD between the word lines is different from the interconnect width WW of the word lines.

The word lines WL are formed using the sidewall transfer technique (sidewall formation process), so that a pattern is finer (a pattern having a smaller dimension) than the limit dimension of the resolution of photolithography. Meanwhile, there are cases where the interconnect width and interconnect interval (interconnect pitch) of the word lines WL have the same dimensions as the limit dimension of the resolution of lithography. For example, the select gate lines SGL are formed using the photolithography technique.

For example, when the wavelength (exposure wavelength) of a light source used for lithography is "λ", the numerical aperture of the lens of an exposure device is "NA" and a process parameter (process difficulty) in lithography is "k1", the limit dimension of the resolution of lithography is represented by following equation (1).

$$k1 \times (\lambda/NA) \qquad \text{(Equation 1)}$$

In addition, with the present embodiment, an immersion exposure technique or phase shift mask may be used for patterning by photolithography.

Based on Equation (1), the dimension (for example, the interconnect width WW of the word lines) of the interconnects formed by performing the sidewall formation process (sidewall transfer technique) a plurality of times (n+11 times where n is an integer of 1 or more) is roughly represented by Equation (2).

$$(k1/2^n) \times (\lambda/NA) \qquad \text{(Equation 2)}$$

In the contact area CA in the drawing area 150, an interconnect interval WC2 between the word lines WL, dimensions WC1 and WC1' of the contact (fringe) 39 connected to the word line and interval WC2 between the contact 39 and interconnect in the contact area CA are greater than the interconnect width WW of the word lines WL. When the fringe 39 has a rectangular planar shape, dimension WC1 of the fringe 39 is the dimension of the short side of the fringe 39 and dimension WC1' of the fringe 39 is the dimension of the long side of the fringe 39. Meanwhile, when the fringe 39 has a square shape, dimension WC1 and dimension WC1' have the same size.

For example, at least one of the interconnect width WW of the word lines WL and interconnect interval WD of the word lines WL is set to (set to less than) $(k1/2^n) \times (\lambda/NA)$ or less.

Interval WC2 between the word lines in the contact area CA is set to greater than $(k1/2^n) \times (\lambda/NA)$. For example, dimensions WC1 and WC1' of the fringe 39 are set to greater than $(k1/2^n) \times (\lambda/NA)$. Meanwhile, dimensions WC1, WC1' and WC2 in the contact area CA may be the limit dimension of the resolution of photolithography or more.

Thus, with the flash memory according to the present embodiment, interval WC2 which is greater than the interconnect pitch (interconnect interval WD) in the memory cell array 100 is secured between the interconnects in the contact area CA.

For example, when an ArF laser is used for the light source for exposure, the exposure wavelength λ is about 193 nm. The numerical aperture NA of the lens of the exposure device is set to, for example, about 1.0 to 1.35. Further, the process parameter k1 is set to, for example, 0.265. In addition, the process parameter k1 takes a large value for a process of low difficulty, and a small value for a process of high difficulty. The theoretical limit value of the process parameter k1 is 0.25.

When, for example, a sidewall mask for forming interconnects (here, word lines) is formed by performing the sidewall formation process twice (=n+1 and n=1), line width WW of the interconnects WL (35) and interval WD between the interconnects is 19 nm or less. Dimension (line width) WC1 of the short side of the contact (fringe) 39 in the contact area CA or interval WC2 between the interconnects (fringe connecting parts) in the contact area CA is set to the dimension greater than 30 nm taking misalignment or fluctuation of dose focus into account. In addition, in this case, a sidewall film formed by the first sidewall formation process is a sacrificial film for forming the sidewall film (sidewall mask) formed by the second sidewall formation process. Further, the dimension of the pattern formed by the second sidewall film is formed at the one fourth of the pitch with respect to the dimension of the sacrificial layer for forming the first sidewall film.

Further, when the sidewall mask for forming the interconnects is formed by performing the sidewall formation process there times (=n+1 and n=2), line width WW of the interconnects WL (35) or interval WD between the interconnects is 9.5 nm or less. Further, dimension (line width) WC1 of the short side of the contact 39 in the contact area CA or the interconnect interval WC2 between the interconnects in the contact area CA is set to the dimension greater than 15 nm taking misalignment or fluctuation of dose focus into account. In addition, in this case, a sidewall film formed by the first and second sidewall formation processes is a sacrificial film for forming the sidewall film (sidewall mask) formed by the third sidewall formation process. Further, the dimension of pattern formed by the third sidewall film is formed at the one eighth of the pitch with respect to the dimension of the sacrificial layer for forming the first sidewall film.

With the semiconductor device according to the present embodiment, interconnects having a line-and-space pattern is formed by performing the sidewall transfer technique (sidewall formation process) a plurality of times. For example, the word lines WL having the line-and-space pattern are formed using a mask formed by repeatedly forming sidewall films (n+1) times (where n is an integer of 1 or more). The sidewall film formed at the $n^{th}$ time is a sacrificial film (referred to as "sidewall sacrificial film") for forming the $(n+1)^{th}$ sidewall film. Further, the sidewall film formed at the $(n+1)^{th}$ time is used as a mask for forming the word lines.

The word lines WL formed by performing the sidewall formation process a plurality of times (n+1 times), for example, have a predetermined interconnect width WW and interconnect interval WD and are adjacent. This interconnect width WW and interconnect interval WD are smaller than the limit dimension according to pattern formation by lithography (exposure).

With the semiconductor device according to the present embodiment including the interconnects formed by performing the sidewall transfer technique (sidewall formation process) (n+1) times, a mask is formed by photolithography such that the $n^{th}$ sidewall film in the contact area is covered before the $(n+1)^{th}$ sidewall film (sidewall mask) is formed using the $n^{th}$ sidewall film as a sacrificial film.

By this means, a wider interval WC2 between the interconnects adjacent in the contact area CA than the interconnect width WW and interconnect interval WS of the interconnects formed by the sidewall formation process (sidewall transfer technique) is secured. Further, in the contact area CA, interval WC2 which does not allow the mask for forming the fringe 39 to step over a plurality of interconnects WL and interval WC2 which does not allow the fringe 39 connected to each interconnect WL to contact (be short-circuited with) the other members are secured. Consequently, short-circuiting of the interconnects WL, fringes 39 and contact plugs CPF is reduced in the contact area CA.

Further, when interval WC2 between the interconnects WL in the contact area CA is made greater, it is possible to increase dimensions WC1 and WC1' of the fringe 39. As a result, it is possible to increase the contact area of the fringe 39 and contact plug CPF and reduce the contact resistance between the fringe 39 and contact plug CPF.

Consequently, with the semiconductor device according to the first embodiment, it is possible to improve reliability of the semiconductor device having a fine pattern without using a complicated manufacturing process.

(c) Manufacturing Method

A method of manufacturing a semiconductor device (for example, flash memory) according to the first embodiment will be described with reference to FIGS. 5A to 18C.

Figure 7A:
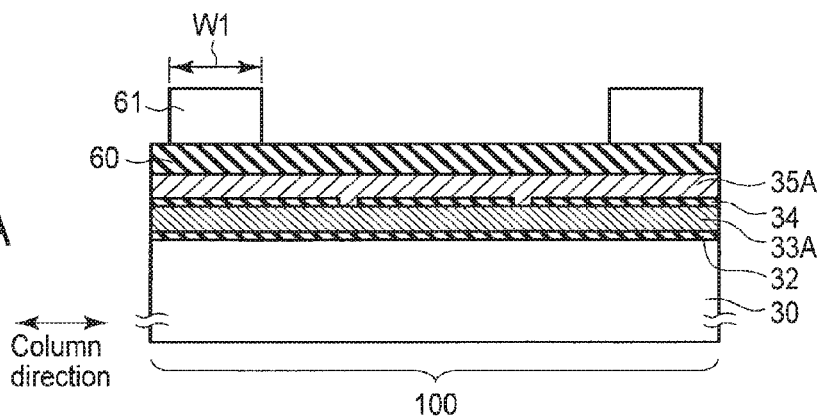
FIGS. 7A, 7B and 7C are sectional views illustrating one process of a semiconductor device manufacturing method according to the first embodiment.
Figure 7B:
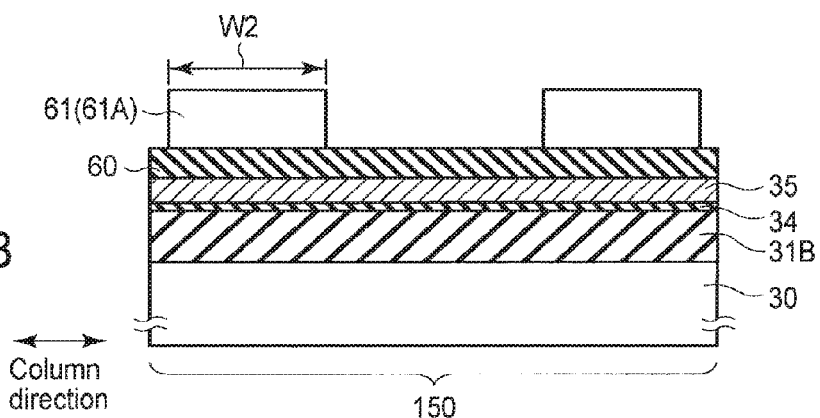
Figure 7C:
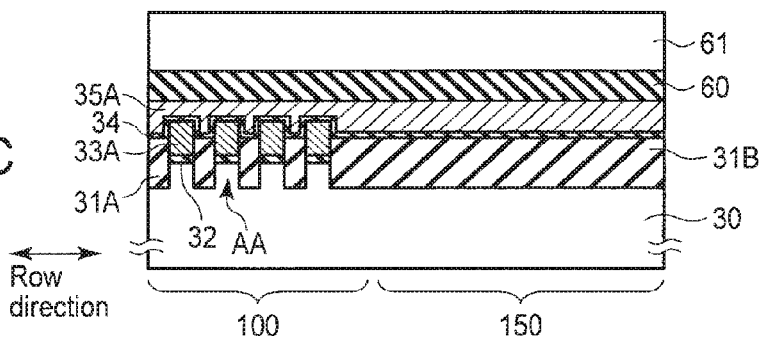

One process of a manufacturing method of a flash memory according to the present embodiment will be described using FIGS. 6, 7A, 7B and 7C. FIG. 6 is a plan view of the memory cell array and drawing area in one process of a manufacturing method of the flash memory according to the present embodiment. FIGS. 7A, 7B and 7C illustrate a cross-sectional structure in FIG. 6. FIG. 7A illustrates a sectional view along line VIIa-VIIa in FIG. 6. FIG. 7B illustrates a sectional view along line VIIb-VIIb in FIG. 6. Further, FIG. 7C illustrates a sectional view along line VIIc-VIIc in FIG. 6.

As illustrated in FIGS. 6, 7A, 7B and 7C, in the memory cell array 100, the insulating film 32 (for example, silicon oxide film) is formed on the semiconductor substrate 30 in which the well region (not illustrated) is formed. The insulating film 32 is formed by, for example, thermal oxidation processing with respect to the silicon substrate. The insulating film 32 is used as the gate insulating film (tunnel insulating film) of the memory cells and the gate insulating film of the select transistors. A first conductive layer (for example, polysilicon) 33A is formed on the insulating film 32 according to, for example, the chemical vapor deposition (CVD) method. The conductive layer 33A on the insulating film 32 is used as the floating gate electrodes of the memory cells and gate electrodes of the select transistors. In addition, instead of polysilicon, the insulating film such as nitride silicon including the trap level with respect to the charge (electron) may be formed on the insulating film 32.

Further, a mask layer (not illustrated) is formed on the conductive layer 33A. Then, a mask layer in the memory cell array is patterned by the photolithography technique or sidewall transfer technique. This mask layer is processed by, for example, the reactive ion etching (RIE) method. By this means, the mask layer (not illustrated) including the line-and-space pattern extending in the column direction is formed on the conductive layer 33A in the memory cell array 100. For example, the mask layer is removed by RIE in the drawing area 150.

Based on the mask layer of this line-and-space pattern, the conductive layer 33A, insulating film 32 and semiconductor substrate 30 are processed by, for example, the RIE method. By this means, in the memory cell array 100, isolation trenches extending in the column direction are formed in the semiconductor substrate 30. The conductive layer 33A and semiconductor area below the conductive layer 33A extend in the column direction. Further, in the drawing area 150, the conductive layer and insulating film are removed by the RIE method, wet etching or ashing, thereby forming trenches.

Further, in the memory cell array 100 and drawing area 150, the insulating films 31A and 31B are formed on the semiconductor substrate 30 such that the trenches are buried. By this means, in the memory cell array 100, the isolation insulating films 31A adopting an STI structure are embedded in the isolation trenches, and element formation areas (active areas) in which the memory cell units CU are arranged are formed. On the surface layer of the semiconductor substrate 30 in the memory cell array 100, a line-and-space pattern formed with the isolation areas (isolation insulating films) and element formation areas (semiconductor areas) are formed. Further, the trench in the drawing area 150 is buried by the isolation insulating film 31B.

In addition, similar to the memory cell array 100, the isolation insulating films and semiconductor areas of the line-and-space pattern may also be formed in the drawing area 150.

After the mask layer on the conductive layer 33A is removed, the insulator (intergate insulating film) 34 is formed on the conductive layer 33A by, for example, the CVD method or chemical reaction (oxidation processing, nitriding processing or radical processing of these) with respect to the conductor. The insulator 34 is used as, for example, the intergate insulating film of the memory cells. In addition, in the area to form the select gate lines, openings (slits) are formed in the insulator 34 such that the upper surface of the conductive layer 33A is exposed.

A second conductive layer 35A is formed on the insulator 34. For the conductive layer 35A, one of silicon (for example, polysilicon), silicide and polycide (layered member of polysilicon and silicide) is used. Meanwhile, the conductive layer 35A may be metal (single element metal or alloy). The conductor 35A is used as control gate electrodes (word lines WL) of the memory cells MC and gate electrodes (select gate lines) of the select transistors.

As described above, members for forming the memory cells and select transistors are formed on the semiconductor substrate 30.

Then, an insulating layer 60 is formed on the conductive layer 35A. The insulating film 60 is, for example, nitride silicon. The pattern formed by the sidewall transfer technique is transferred to the insulating layer 60 on the conductive layer 35A. The insulating layer 60 is also referred to as a "pattern transfer layer". A sacrificial layer (also referred to as "core") 61 is deposited on the pattern transfer layer 60. The sacrificial layer 61 is processed to a predetermined pattern by, for example, the photolithography technique and RIE method. With the example illustrated in FIGS. 6 to 7C, a planar pattern of the sacrificial layer 61 has a line pattern extending in the row direction and a projecting pattern (projecting part) 61A connected to this line pattern. The projecting part 61A projects in the column direction in the horizontal direction with respect to the substrate surface. For example, the projecting part 61A projects toward the boundary side of the blocks. A dimension (line width) W2 of the projecting part 61A in the horizontal direction (column direction) with respect to the substrate surface is wider than a line width W1 of the sacrificial layer 61 in the memory cell array 100.

For example, a material different from the pattern transfer layer 60 is used for the sacrificial layers 61 and 61A, and the sacrificial layers 61 and 61A are made of a resist or polysilicon (or amorphous silicon). The sacrificial layers 61 and 61A and pattern transfer layer 60 are made of different materials, so that a predetermined etching selectivity is secured between the sacrificial layers 61 and 61A and pattern transfer layer 60.

For example, in the memory cell array 100, dimension (line width) W1 of the line pattern of the sacrificial layer 61 is preferably patterned and processed to have a dimension (for example, about 40 nm to 80 nm) which is four times the interconnect width WW of the interconnect pattern (word lines) to be formed.

For example, an ArF laser is used for the light source of exposure for photolithography. The exposure wavelength $\lambda$ of the ArF laser is set to, for example, about 193 nm. Further, the numerical aperture NA of the lens of the exposure device is set to, for example, about 1.0 to 1.35. The process parameter k1 is set to, for example, about 0.265.

Figure 9A:
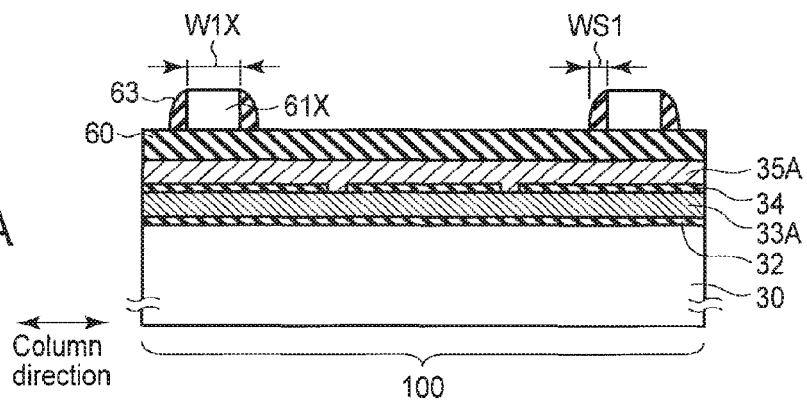
FIGS. 9A, 9B and 9C are sectional views illustrating one process of a semiconductor device manufacturing method according to the first embodiment.
Figure 9B:
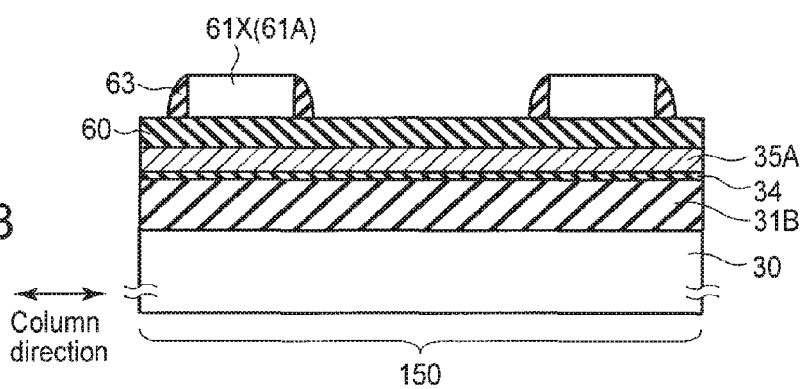
Figure 9C:
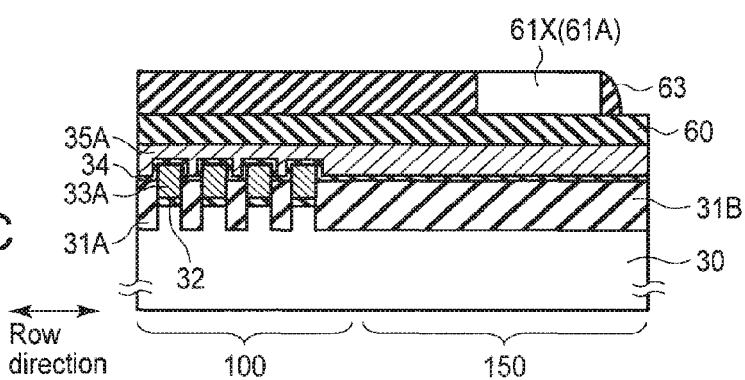

One process of a manufacturing method of a flash memory according to the present embodiment will be described using FIGS. 8, 9A, 9B and 9C. FIG. 8 is a plan view of the memory cell array and drawing area in one process of the manufacturing method of the flash memory according to the present embodiment. FIGS. 9A, 9B and 9C illustrate a cross-sectional structure in FIG. 8. FIG. 9A illustrates a sectional view along line IXa-IXa in FIG. 8. FIG. 9B illustrates a sectional view along line IXb-IXb in FIG. 8. Further, FIG. 9C illustrates a sectional view along line IXc-IXc in FIG. 8.

As illustrated in FIGS. 8, 9A, 9B and 9C, the sacrificial layers are slimmed in the memory cell array 100 and drawing area 150 by, for example, etching back the sacrificial layers. This slimming reduces the dimensions of a sacrificial layers 61X. The condition of etch-back (etching) for slimming is set such that a line width W1X of the sacrificial layers 61X in the memory cell array 100 is, for example, about half line width W1 upon patterning by lithography. The dimensions of the projecting parts 61A in the drawing area 150 are reduced by etch-back.

In addition, etch-back for slimming the sacrificial layers 61X may be the RIE method or wet etching as long as the sacrificial layers 61X are selectively etched compared to the pattern transfer layer 60.

After the sacrificial layers 61X are slimmed, the sidewall member (mask member) having a predetermined film thickness is deposited by the CVD method such that the pattern transfer layer 60 and sacrificial layers 61X are covered. Further, etch-back of a predetermined condition is applied to the sidewall members such that the sidewall members are left on the lateral surfaces (side surfaces) of the sacrificial layer 61 and projecting part 61A. A first sidewall film 63 of a closed loop is formed by this first sidewall formation process on the lateral surfaces of the sacrificial layer 61X and projecting part 61A to surround the surrounding of the sacrificial layer 61X. The first sidewall film 63 is a sacrificial layer for forming the sidewall mask for processing the word lines. Hereinafter, the sidewall film 63 is also referred to as a "sacrificial sidewall film 63".

For example, in the drawing area 150, the planar pattern of the sidewall film 63 deforms depending on the shape of the projecting part 61A provided in the sacrificial layer 61X. For example, the sidewall film 63 in the drawing area 150 is bent toward the boundary side of blocks BLKi and BLK(i+1).

A line width WS1 of the sidewall film 63 is less than the limit dimension of the resolution of lithography. Line width WS1 of the sidewall film 63 is line width W1X of the sacrificial layer 61 or less. For example, line width WS1 of the sidewall film 63 is preferably within a range between the same dimension as line width WW of the interconnect pattern (word lines) to be formed and the double line width WW of the word lines.

The film thickness of the sidewall member and etch-back condition are preferably set adequately such that line width WS1 of this value is acquired. Meanwhile, the material for forming the sidewall film 63 and etch-back condition are adequately selected such that the sidewall film (sidewall member) is selectively etched compared to the sacrificial layers 61X and insulating layer (pattern transfer layer) 60. For example, oxide silicon is used for the material (sidewall member) of the sidewall film 63. Meanwhile, as long as the sidewall films 63, sacrificial layers 61X and pattern transfer layer 60 can secure the predetermined etching selectivity, a combination of materials of the sidewall films 63, sacrificial layers 61X and pattern transfer layer 60 is not limited to the above example.

Thus, the sidewall film 63 (first sidewall film) is formed by the first sidewall formation process on the lateral surface of the sacrificial layer 61X. Line width WS1 of the sidewall film 63 is nearly half the line width of the pattern of the sacrificial layer 61 or less. The line widths of the sidewall film 63 and sacrificial layer 61 formed by lithography for forming the sidewall film 63 have a relationship of half the pitch.

Figure 10:
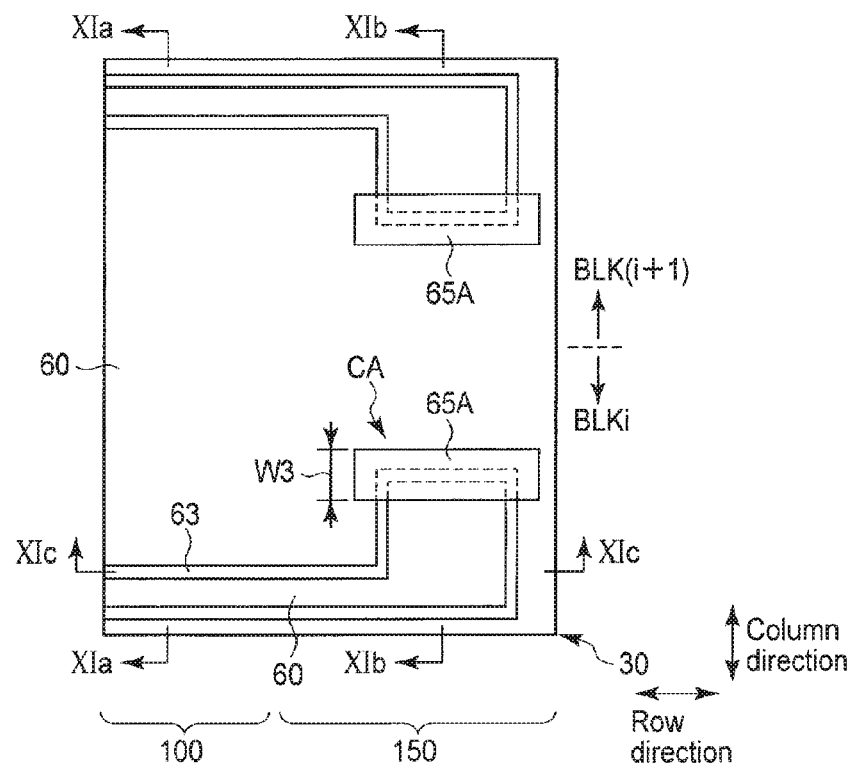
FIG. 10 is a plan view illustrating one process of a semiconductor device manufacturing method according to the first embodiment.
Figure 11A:
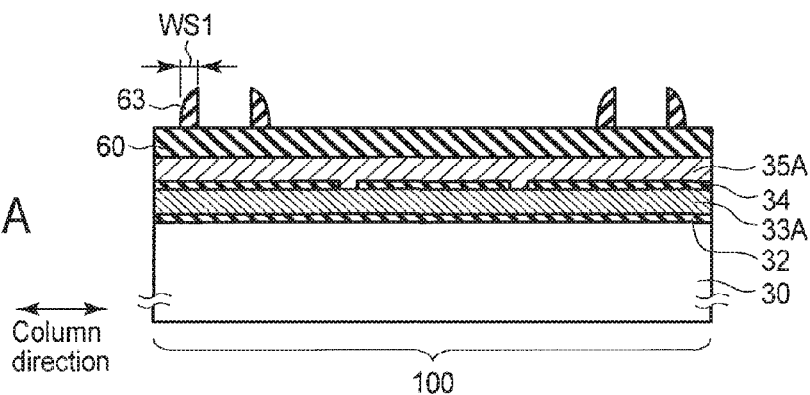
FIGS. 11A, 11B and 11C are sectional views illustrating one process of a semiconductor device manufacturing method according to the first embodiment.
Figure 11B:
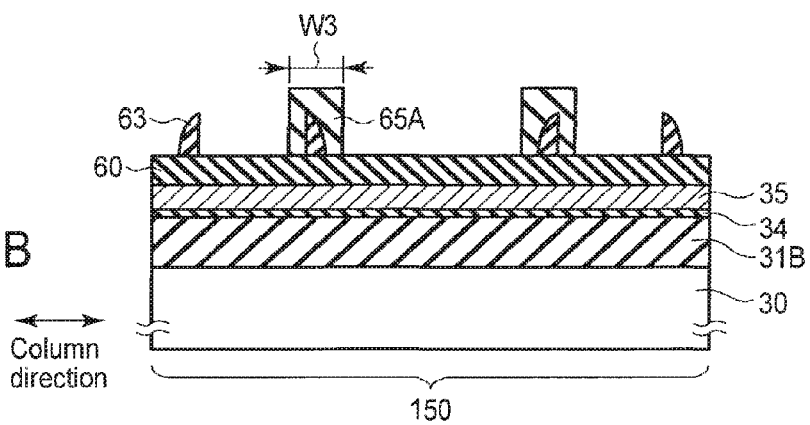
Figure 11C:
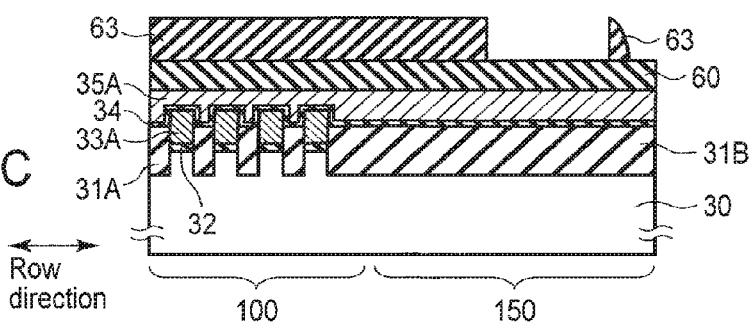

One process of a manufacturing method of the flash memory according to the present embodiment will be described using FIGS. 10, 11A, 11B and 11C. FIG. 10 is a plan view of the memory cell array and drawing area in one process of a manufacturing method of the flash memory according to the present embodiment. FIGS. 11A, 11B and 11C illustrate a cross-sectional structure in FIG. 10. FIG. 11A illustrates a sectional view along line XIa-XIa in FIG. 10. FIG. 11B illustrates a sectional view along line XIb-XIb in FIG. 10. Further, FIG. 11C illustrates a sectional view along line XIc-XIc in FIG. 10.

As illustrated in FIGS. 10, 11A, 11B and 11C, after the sacrificial layer is removed, resist masks 65A are formed on the pattern transfer layer 60 by the photolithography technique and etching. In addition, the resist masks 65A may be slimmed such that the line width of the resist masks 65A is not smaller than the line width of the sidewall films 63. Further, the resist masks 65A may be patterned using the immersion exposure technique. The resist mask 65A is formed to cover the sidewall film 63. The resist masks 65A are formed in the contact area in which a plurality of contacts (fringes) are arranged in the drawing area 150.

A dimension (line width) W3 of the resist mask 65A is wider than line width WS1 of the sidewall film 63. For example, line width W3 of the resist mask 65A is set to about the limit dimension of the resolution of lithography. Meanwhile, there are cases where line width W3 of the resist mask 65A is smaller than the limit dimension of the resolution of lithography due to the influence of the proximity effect and slimming processing of the resist mask.

Figure 12:
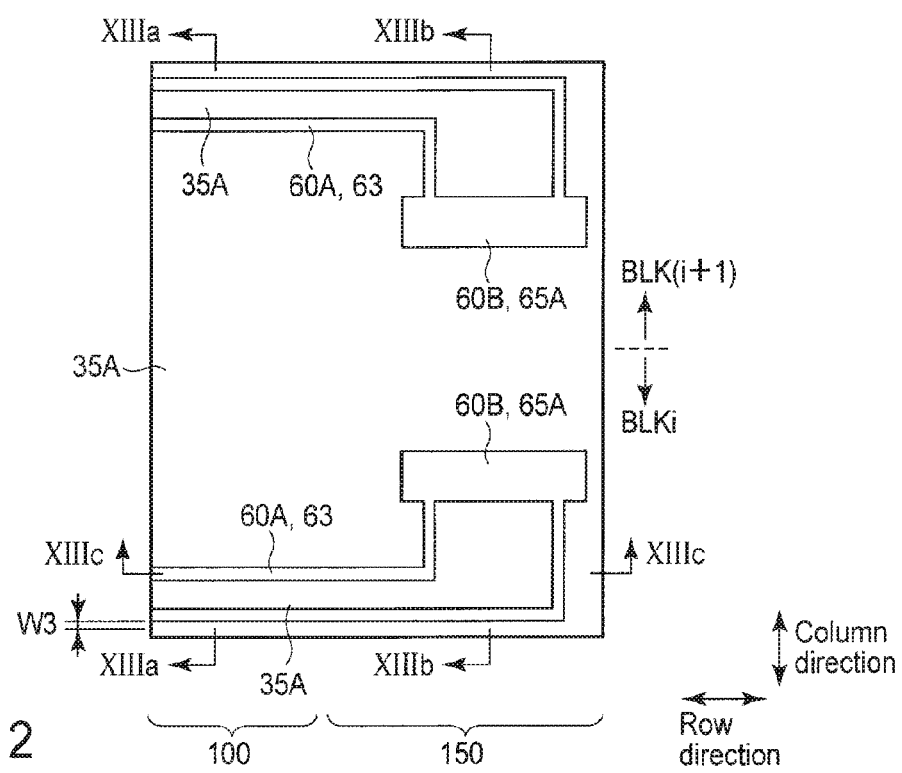
FIG. 12 is a plan view illustrating one process of 2C) a semiconductor device manufacturing method according to the first embodiment.
Figure 13A:
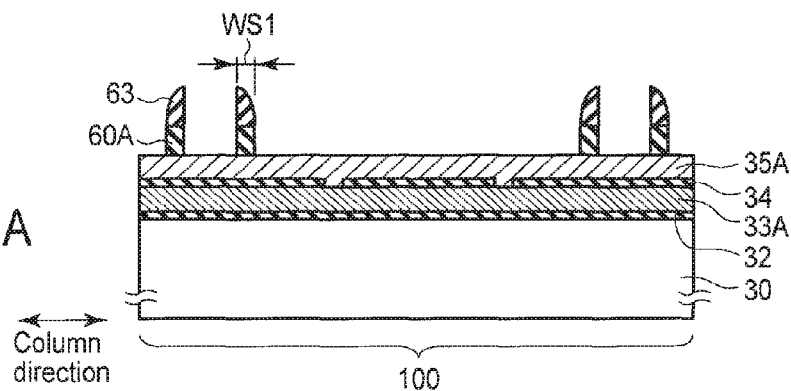
FIGS. 13A, 13B and 13C are sectional views illustrating one process of a semiconductor device manufacturing method according to the first embodiment.
Figure 13B:
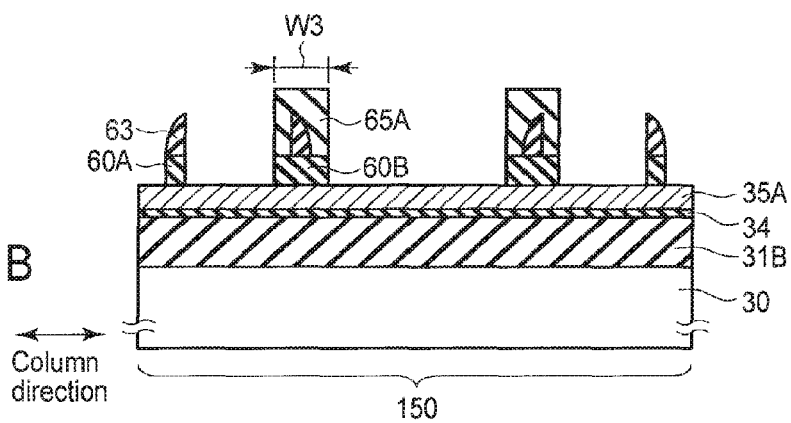
Figure 13C:
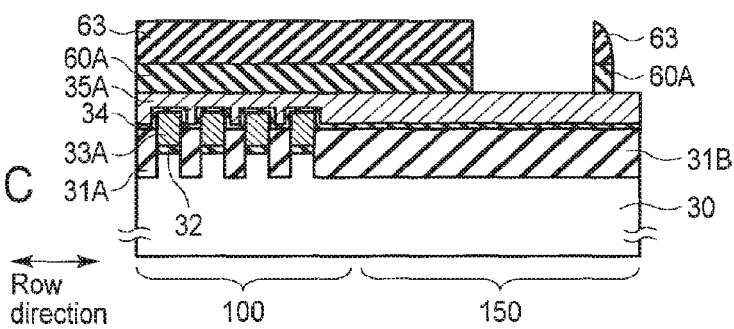

One process of a manufacturing method of the flash memory according to the present embodiment will be described using FIGS. 12, 13A, 13B and 13C. FIG. 12 is a plan view of the memory cell array and drawing area in one process of a manufacturing method of the flash memory according to the present embodiment. FIGS. 13A, 13B and 13C illustrate a cross-sectional structure in FIG. 12. FIG. 13A illustrates a sectional view along line XIIIa-XIIIa in FIG. 12. FIG. 13B illustrates a sectional view along line XIIIb-XIIIb in FIG. 12. Further, FIG. 13C illustrates a sectional view along line XIIIc-XIIIc in FIG. 12.

As illustrated in FIGS. 12, 13A, 13B and 13C, a mask member which is the underlayer of the sidewall films 63 and resist masks 65A is etched using the sidewall films 63 and resist masks 65A as masks. By this means, the pattern formed with the sidewall films 63 and resist masks 65A is transferred to the mask member, and pattern transfer layers 60A and 60B are formed on the conductive layer 35A.

Here, the portion 60A of the pattern transfer layer patterned by the sidewall film 63 has a line width which depends on the dimension of the sidewall film 63. The portion 60A is referred to as a "sacrificial line pattern layer 60A". Line width WS1 of the sacrificial line pattern layer 60A is about the same as line width WS1 of the sidewall film 63. For example, line width WS1 of the sacrificial line pattern layer 60A has a line width in a range between line width WW of the word lines to be formed and about the double line width WW of the word lines.

Further, the portion 60B of the pattern transfer layer patterned by the resist mask 65A has line width W3 wider than the portion 60A patterned by the sidewall film 63. The portion 60B is referred to as a "sacrificial rectangular pattern layer 60B". For example, line width W3 of the sacrificial rectangular pattern layer 60B is processed based on the resist mask 65A, and therefore is, for example, the limit dimension of the resolution of lithography or more. Meanwhile, there are cases where, due to slimming processing of the mask 65A, line width W3 of the sacrificial rectangular pattern layer 60B is smaller than the limit dimension of the resolution of lithography.

Hereinafter, when the sacrificial line pattern layers 60A and sacrificial rectangular pattern layers 60B are not distinguished, these are referred to as "sacrificial pattern layers 60A and 60B".

One process of a manufacturing method of the flash memory according to the present embodiment will be described using FIGS. 14, 15A, 15B and 15C. FIG. 14 is a plan view of the memory cell array and drawing area in one process of a manufacturing method of the flash memory according to the present embodiment.

Figure 15A:
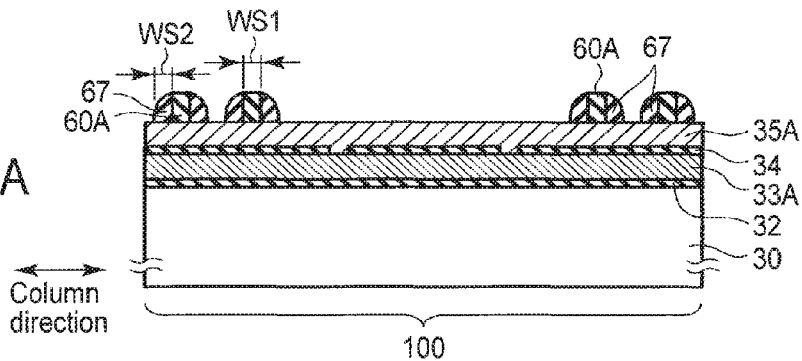
FIGS. 15A, 15B and 15C are sectional views illustrating one process of a semiconductor device manufacturing method according to the first embodiment.
Figure 15B:
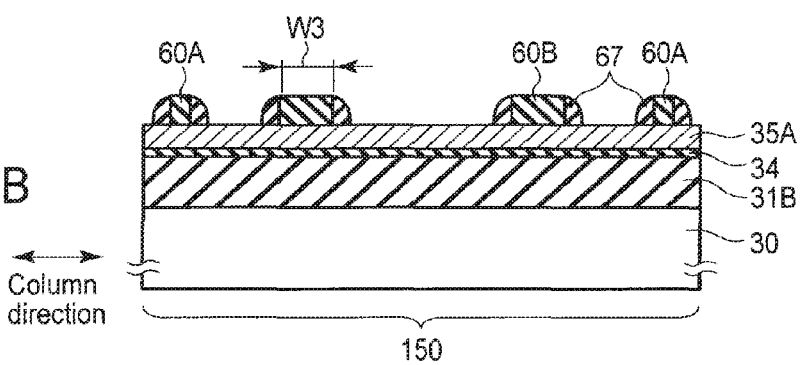
Figure 15C:
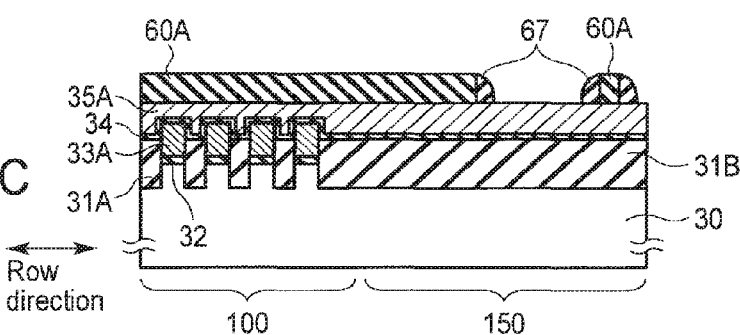

FIGS. 15A, 15B and 15C illustrate a cross-sectional structure in FIG. 14. FIG. 15A illustrates a sectional view along line XVa-XVa in FIG. 14. FIG. 15B illustrates a sectional view along line XVb-XVb in FIG. 14. Further, FIG. 15C illustrates a sectional view along line XVc-XVc in FIG. 14.

After the sidewall films and resist mask for forming the sacrificial pattern layers 60A and 60B are removed, as illustrated in FIGS. 14, 15A, 15B and 15C, the second sidewall members (for example, oxide silicon) are formed by the CVD method on the pattern layers 60A and 60B and conductive layer 35A. Further, the sidewall members are etched back, thereby forming second sidewall films 67 on the lateral surfaces of sacrificial pattern layers 60A and 60B.

In addition, before the sidewall films 67 are formed, the sacrificial pattern layers 60A and 60B may be slimmed.

By this means, the second sidewall film 67 of a closed loop is formed by the second sidewall formation process on the lateral surface of the sacrificial line pattern layer 60A to surround the sacrificial line pattern layer 60A formed based on the first sacrificial sidewall film. The sidewall film 67 having a line pattern is a mask for processing the conductive layer 35A. Hereinafter, the sidewall film 67 will be referred to as a "sidewall mask 67" for ease of description.

A line width WS2 of the sidewall mask 67 is line width WS1 of the sacrificial line pattern layer 60A or less. For example, line width WS2 of the sidewall mask 67 is formed within the range between about line width WS1 of the sacrificial line pattern layer 60A and about half line width WS1. In addition, line width W1X of the above slimmed sacrificial layer 61X is preferably wider than the double dimension of line width WS2 of the sidewall mask 67 such that the two sidewall masks 67 between the two sacrificial sidewall films do not contact.

Further, in the drawing area 150, the sidewall masks 67 are formed on the lateral surfaces of the sacrificial rectangular pattern layers 60B. In the contact area, the interval between the sidewall masks 67 sandwiching the rectangular pattern layer 60B is greater than the interval (for example, interval WS1) between the adjacent sidewall masks 67 in the memory cell array 100. For example, the interval between the sidewall masks 67 has about line width W3 of the rectangular pattern layer 60B. Interval W3 between the sidewall masks 67 sandwiching the sacrificial pattern 60B in the contact area CA is, for example, preferably 30 nm or more. In addition, interval W3 between the sidewall masks 67 sandwiching the sacrificial pattern 60B in the contact area CA may be the limit dimension of the resolution of lithography or more.

Thus, the second sidewall film (sidewall mask) 67 is formed by the second sidewall formation process on the lateral surface of the pattern (sacrificial sidewall film and sacrificial pattern layer based on the sacrificial sidewall film) based on the first sidewall formation process. The second sidewall mask 67 is formed above the position at which the word lines (memory cells) are formed.

When line width WS2 of the sidewall mask 67 is about half line width WS1 of the sacrificial sidewall film, line width WS2 of the sacrificial mask 67 is about the one fourth of the line width of the sacrificial layer for forming the sacrificial sidewall film. The sidewall mask 67 and the sacrificial layer 61 formed by lithography to form the sacrificial sidewall film 63 have, for example, a relationship of the one fourth of the pitch.

In addition, although, with the present embodiment, the sidewall masks 67 are formed on the lateral surfaces of the sacrificial pattern layers 60A and 60B, the sidewall masks 67 may be formed on the lateral surfaces of the first sidewall film 63 and resist masks 65A. Further, after the first sidewall films 63 and resist masks 65A are removed, the sacrificial pattern layer (hard mask layer) may be processed using the sidewall masks 67 as masks. In this case, the core, first sidewall films 63, resist masks 65A and sidewall masks 67 may be directly formed on the conductive layer 35 without forming the mask member (sacrificial line patterns 60A) on the conductive layer 35.

Figure 17A:
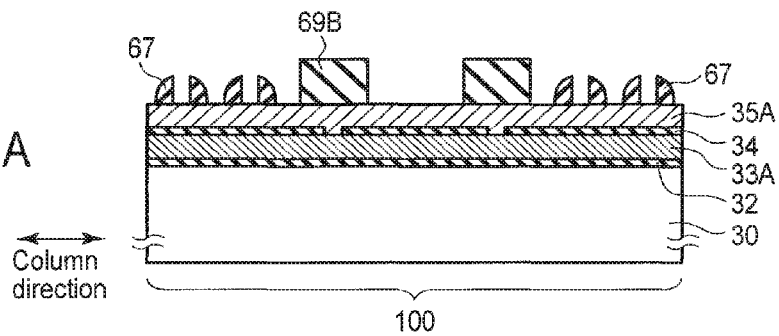
Figure 17B:
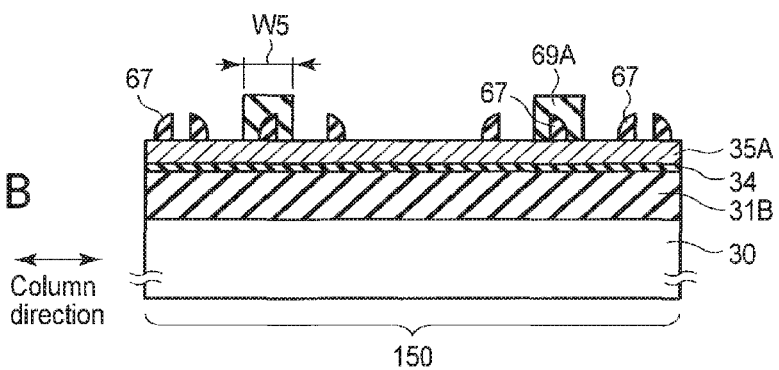
Figure 17C:
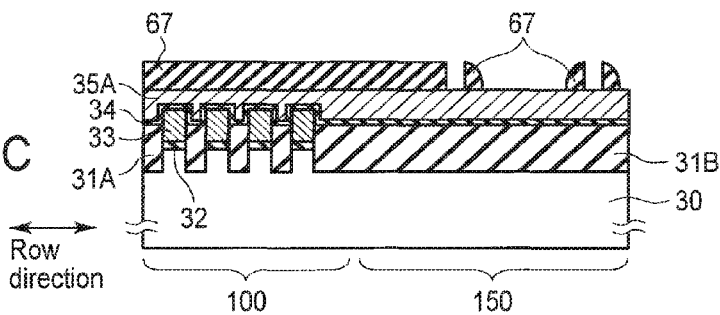

One process of a manufacturing method of the flash memory according to the present embodiment will be described using FIGS. 16 to 18C. FIG. 16 is a plan view of the memory cell array and drawing area in one process of a manufacturing method of the flash memory according to the present embodiment. FIGS. 17A, 17B and 17C illustrate a cross-sectional structure in FIG. 16. FIG. 17A illustrates a sectional view along line XVIIa-XVIIa in FIG. 16. FIG. 17B illustrates a sectional view along line XVIIb-XVIIb in FIG. 16. FIG. 17C illustrates a sectional view along line XVIIc-XVIIc in FIG. 16.

As illustrated in FIGS. 16, 17A, 17B and 17C, after the sacrificial pattern layer for forming the sidewall masks 67 is removed, resist masks 69A are formed by photolithography and etching at positions to form fringes (contacts) to be connected to the word lines in the contact area CA in the drawing area 150. Dimensions W4 and W4' of the resist mask 69A is set to line width WS2 of the sidewall mask 67 or more. Dimensions W4 and W4' of the resist mask 69A can be reduced smaller than the limit dimension of the resolution of lithography by slimming the resist mask.

An interval W5 between the sidewall masks 67 covered by a resist mask 69 in the contact area CA is greater than interval WS1 between the adjacent sidewall masks 67 in the memory cell array 100. For example, interval W5 between the sidewall masks 67 in the contact area CA is greater than $(k1/2'')\times(\lambda/NA)$. Here, the wavelength (exposure wavelength) of a light source used for lithography is "$\lambda$", the numerical aperture of the lens of an exposure device is "NA" and a process parameter (process difficulty) in lithography is "k1", and the value based on the number of times (n+1) of the sidewall formation process (sidewall transfer process) is "n". For example, with the present embodiment, when the interconnect pattern (word lines) is formed by performing the sidewall formation process twice, interval W5 is preferably 30 nm or more.

Consequently, it is possible to secure a margin for forming the resist masks 69 in the contact area, and prevent poor patterning of one resist mask 69 stepping over the two sidewall masks 67 or prevent the two resist masks 69 from contacting each other.

In the memory cell array 100, the interval (space) between the adjacent sidewall masks 67 is about the same as line width WS1 of the removed sacrificial sidewall film (first sidewall film). However, there are cases where the interval between positions at which the curved surface sides of the sidewall masks 67 oppose to each other are different from line width WS1 of the sacrificial side wall film.

For example, at the same time when the resist masks 69A for forming fringes are formed, the resist masks 69B for forming select gate lines (select transistors) are formed.

Figure 18A:
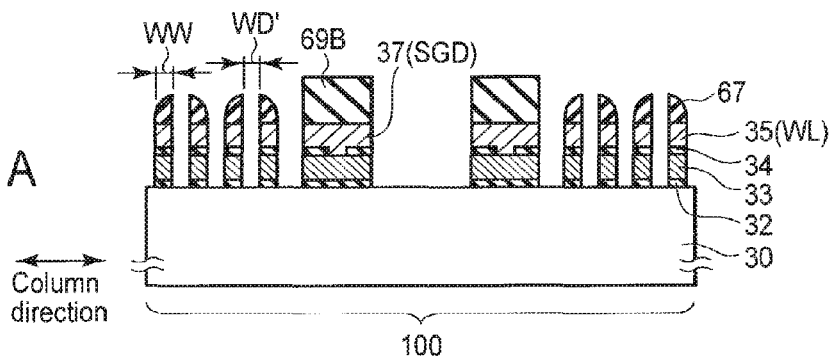
FIGS. 18A, 18B and 18C are sectional views illustrating one process of a semiconductor device manufacturing method according to the first embodiment.
Figure 18B:
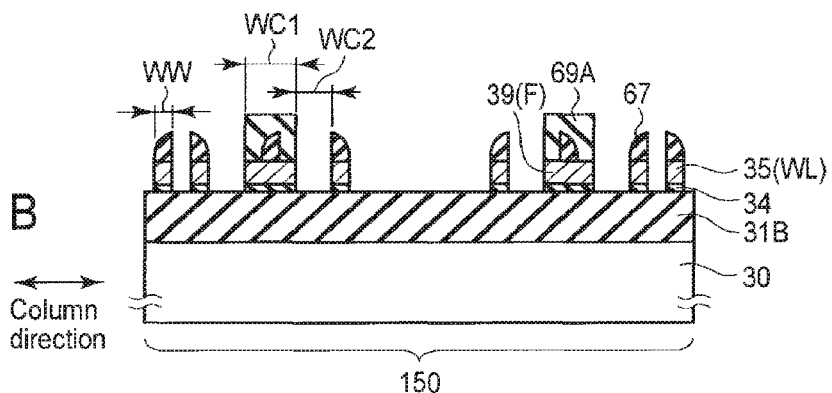
Figure 18C:
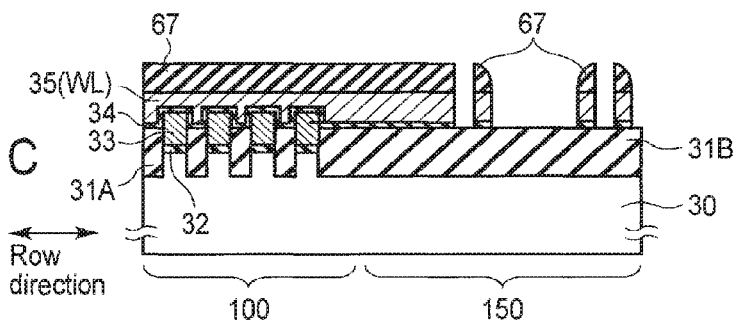

FIGS. 18A, 18B and 18B illustrate a manufacturing process subsequent to FIGS. 16, 17A, 17B, and 17C, more specifically, the etched cross-sectional structure subsequent to manufacturing process illustrated in FIGS. 16 to 17C. FIG. 18A is a sectional view after etching in FIG. 17A. FIG. 18B is a sectional view after etching in FIG. 17B. FIG. 18C is a sectional view after etching in FIG. 17C.

A processing target layer on the semiconductor substrate 30 is etched by, for example, the RIE method using the sidewall masks 67 and resist masks 69A and 69B as masks. With the present embodiment, the processing target layer is the conductive layers 35A and 33A and insulator 34 layered on the semiconductor substrate 30. Meanwhile, with the present embodiment, the processing target layer processed by the sidewall masks formed based on the sacrificial sidewall films may adopt a single layer structure of the conductive layer or insulating layer.

As illustrated in FIGS. 18A, 18B and 18C, according to etching, the interconnect pattern and gate pattern are formed on the semiconductor substrate 30 based on the sidewall masks 67 and resist masks 69A and 69B. By this means, the interconnects (word lines) WL in the line-and-space pattern are formed in the memory cell array 100.

In the memory cell array 100, the stack gate structure of the memory cells is formed based on the sidewall masks 67. The stack gate structure of the memory cells includes the floating gate electrodes 33 on the gate insulating film 32, intergate insulating films (insulators) 34 on the floating gate electrodes 33 and control gate electrodes 35 on the intergate insulating films 34. The control gate electrodes 34 are used as the word lines WL. The word lines WL extend from the inside of the memory cell array 100 to the inside of the drawing area 150. The word line WL is a control gate electrode of the memory cell MC, and crosses the active area in the memory cell array 100.

The word line WL has the interconnect width WW. The interconnect width WW is substantially the same as line width WS2 of the sidewall mask (second sidewall film) 67 for processing the conductive layer. In the memory cell array 100, interval WD between the adjacent word lines has, for example, substantially the same size as line width WS1 of the sacrificial sidewall film (first sidewall film) for forming the sidewall mask. In addition, interval WD between the word lines is preferably substantially the same as the interconnect width WW. Hence, the dimensions of the sidewall mask for forming the word lines WL and each sacrificial layer are preferably designed adequately. At least one of the interconnect width WW and interconnect interval WD of the word lines WL is formed to be less than or equal to (here, n=1) $(k1/2'')\times(\lambda/NA)$.

In the drawing area 150, the interconnect pattern of a loop which serves as the word lines WL are formed to be bent at predetermined portions.

In the contact area CA in the drawing area 150, the fringes 39(F) connected to the word lines WL are formed based on the resist masks 69A. Hence, a dimension WC4 of the short side of the fringe 39 is wider than the interconnect width WW of the word lines WL.

With the present embodiment, at a position to form the fringe 39 in the contact area CA, interval WC2 between the adjacent word lines WL is wider than interval WD between the word lines WL in the memory cell array 100. In the contact area CA, interval WC2 between the word lines WL is, for example, greater than (here, n=1) $(k1/2'')\times(\lambda/NA)$, above. When the interconnect pattern for forming the word lines is formed by performing the sidewall formation process twice, at a fringe connecting portion in the contact area CA, interval WC2 between the word lines WL is preferably greater than 30 nm taking misalignment and fluctuation of dose focus into account. Meanwhile, interval WC2 between the word lines WL at the fringe connecting portion in the contact area CA may be the limit dimension of the resolution of lithography or more.

Further, in the memory cell array 100, at the same time when the word lines WL and fringes 39 are formed, the gate electrodes of the select transistors and select gate lines are formed. In addition, the mask for patterning the select gate formation area may be formed at the same time when the sacrificial pattern is formed in process illustrated in FIGS. 10 to 15C without being formed at the same time when the resist masks for forming the fringes are formed.

Thus, in the memory cell array 100, the sidewall masks 67 having the line-and-space pattern formed by performing the sidewall transfer process (n+1) times are formed. The interconnect pattern formed by the sidewall mask 67 has the line width smaller than the limit dimension of the resolution of lithography. Further, in the drawing area 150, the dimension greater than interval WD between the interconnect patterns formed by the sidewall mask 67 is secured as interval WC2 between the interconnect patterns at the fringe connecting portion.

Consequently, in the contact area CA, interval WC2 between the interconnect patterns formed by the sidewall mask is wider than interval WD between the interconnect patterns in the memory cell array 100. Consequently, at the fringe connecting portion in the contact area CA, short-circuiting between the adjacent word lines WL and between adjacent fringes is prevented.

As illustrated in FIG. 5, after the memory cells MC, select transistors ST, word lines WL and select gate lines SGL are formed, ions are implanted using the formed gate electrodes as masks and the diffusion layers 40A and 40B are formed in the semiconductor substrate 30.

Then, by cutting the loop of (etching) the interconnect pattern of the closed loop, the word lines 35 (WL) are formed in a pattern to be respectively independent.

Further, in the memory cell array 100 and drawing area 150, interlayer insulating film 51 is deposited on the semiconductor substrate 30 by, for example, the CVD method to cover the memory cells MC, select transistors ST, word lines WL and select gate lines SGL.

At a predetermined position in interlayer insulating film 51, contact holes are formed, and contact plugs CP1, CP2 and CPF are embedded in the contact holes.

In the memory cell array 100, contact plug CP1 is connected to the diffusion layer 40B shared by the select transistors ST adjacent in the column direction.

Contact plug CPF is provided on the fringe 39 in the drawing area 150. As described above, between the adjacent fringes 39 and adjacent word lines in the contact area CA, interval WC2 wider than the interconnect width WW (or interval WD between the word lines) of the word lines WL in the memory cell array 100 is provided. Consequently, short-circuiting of contact plugs CPF is prevented.

Further, dimensions WC1 and WC1' of the fringe 39 are greater than the interconnect width WW of the word lines WL. Hence, a margin for misalignment of the contact plugs (contact holes) and fringes 39 increases. Further, it is possible to increase the contact area of the fringes 39 and contact plugs CPF, thereby reducing the contact resistance between the fringes 39 and contact plugs.

Further, in the memory cell array 100 and drawing area 150, a metal layer is deposited on interlayer insulating film 51 by, for example, the spattering method. In the memory cell array 100, the deposited metal layer is processed to a predetermined pattern. By this means, a plurality of first interconnect layers M1 are formed respectively on contact plugs CP1 and CP2 and interlayer insulating film 51 to be connected to contact plugs CP1 and CP2. At the same time, in the drawing area 150, a plurality of interconnect layers (drawing interconnects) M0 extending from the row control circuit 101 are formed on contact plugs CPF and interlayer insulating film 51 to be connected to contact plugs CPF.

On interlayer insulating film 51 and interconnect layer M1, the second interlayer insulating film 52 is deposited by, for example, the CVD method. Further, in interlayer insulating film 52, the contact holes are formed, and the via plug V1 is formed at a predetermined position in the memory cell array 100.

Further, in the memory cell array 100, the third interconnect layer M1 which is the bit lines BL is formed on interlayer insulating film 52 to be connected to the via plug V1. The first and second interconnect layers M0 and M1 are patterned and processed using the photolithography technique or sidewall transfer technique. The first and second interconnect layers M0 and M1 may be formed using a damascene method.

In addition, the second interconnect layer M1 and via plug V1 may be formed in the drawing area 150 according to the connection relationship between the word lines WL and row control circuit 101.

According to the above process, the semiconductor device (for example, flash memory) according to the present embodiment is formed.

In addition, although, with the manufacturing method of the flash memory according to the present embodiment, the interconnect pattern of the line-and-space pattern is formed in the memory cell array 100 by performing the sidewall transfer process twice, with the present embodiment, as long as the interconnect pattern is executed by performing the sidewall transfer process twice or more in the manufacturing method, the number of times of sidewall transfer processes is by no means limited. When, for example, the interconnect pattern of the line-and-space pattern is formed by performing the sidewall transfer process three times, the line-and-space pattern of the one eighth of the pitch of the sacrificial layer for forming the first sidewall film is formed. As in the process illustrated in FIGS. 10 to 11C, patterning using the resist mask to secure the interval between the adjacent interconnect patterns in the contact area CA may be executed only between the first and second sidewall formation processes or may be executed between respective sidewall formation processes according to a layout.

When the interconnect pattern is formed by performing the sidewall transfer process three times, the interconnect width WW of the interconnect pattern (word lines) to be formed is preferably 9.5 nm or less. Interval WC2 between the adjacent interconnect patterns in the contact area CA is preferably greater than 15 nm. In addition, in this case, line width W1 of the sacrificial layer 61 for forming the first sidewall film is preferably about eight times the interconnect width of the interconnect pattern to be formed.

As described above, the manufacturing method of the flash memory according to the present embodiment includes a plurality of times of (n+1) sidewall formation processes. With the present embodiment, the sidewall film formed by the $n^{th}$ sidewall formation process is a sacrificial pattern for the sidewall film formed by the $(n+1)^{th}$ sidewall formation process. Further, using the sidewall film formed by the $(n+1)^{th}$ sidewall formation process as a mask, a processing target layer (word lines and gate electrodes of the transistors) is processed. Therefore, at least one of the interconnect width WW and interconnect interval WD of the word lines WL is less than or equal to $(k1/2^n) \times (\lambda/NA)$.

With the present embodiment, before the $(n+1)^{th}$ sidewall film is formed, resist masks are formed to cover the $n^{th}$ sidewall film in the contact area CA in which the fringes are provided. In the contact area CA, the $(n+1)^{th}$ sidewall film is formed on the lateral surfaces of the pattern based on the resist masks.

Hence, intervals W5 and WC2 between the $(n+1)^{th}$ sidewall film and interconnect patterns formed by the sidewall film in the contact area CA are greater than interval WW between the interconnect patterns (here, word lines) in the memory cell array 100. For example, intervals W5 and WC2 between the interconnect patterns in the contact area CA are greater than $(k1/2^n) \times (\lambda/NA)$.

Consequently, in the contact area CA, one resist mask for forming the fringes can be formed without covering a plurality of sidewall masks.

Consequently, according to the present embodiment, it is possible to secure a margin of a layout for forming the resist mask in the contact area. Further, it is possible to prevent short-circuiting which occurs between the fringes, interconnects and contacts in the contact area.

As a result, with the present embodiment, it is possible to prevent a decrease in the yield of manufacturing the semiconductor device caused by miniaturization of the semiconductor device. Further, with the present embodiment, it is possible to form interconnects including different dimensions (interconnect width or interconnect interval) and contacts connected to these interconnects without adding a complicated manufacturing process.

Consequently, with the semiconductor device and manufacturing method of the semiconductor device according to the present embodiment, it is possible to improve reliability of the semiconductor device including a fine pattern without using the complicated manufacturing process.

(2) Second Embodiment

A manufacturing method of a semiconductor device according to the second embodiment will be described with reference to FIGS. 19 to 21B. In addition, components and a manufacturing process which are common in the semiconductor device and manufacturing method of the semiconductor device according to the first embodiment will be described where necessary.

An example has been described with the first embodiment where, in a contact area CA, pattern having a greater dimension than a fine pattern processed by a sidewall mask using a resist mask.

However, the pattern having a greater dimension than the pattern processed by the sidewall mask may be formed utilizing the difference produced in etching bias depending on the space width (interval or pitch) between adjacent patterns without using the resist mask.

Figure 19:
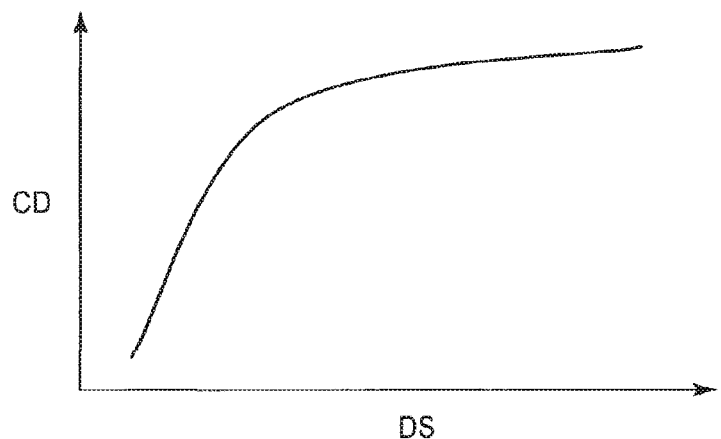
FIG. 19 is a view for describing a semiconductor device manufacturing method according to the second embodiment.

FIG. 19 is a graph illustrating an example of the relationship between the space width between the adjacent mask patterns in an etching process and conversion difference (pattern line width fluctuation amount) of the formed pattern. The horizontal axis in FIG. 19 indicates a space width DS between the mask patterns. The vertical axis in FIG. 19 indicates a conversion difference (also referred to as "etching bias") CD between dimensions of the mask pattern and pattern to be formed. With the present embodiment, the conversion difference CD between the patterns indicates the conversion difference (Wea−Web) between a line width Wea of a pattern processed under a predetermined etching condition and a line width Web of the mask pattern before etching in a state where the two mask patterns are adjacent.

As illustrated in FIG. 19, when the space width DS of the mask pattern increases, the conversion difference CD increases. That is, line width Wea of the pattern to be formed is wider than line width Web of the mask pattern.

As illustrated in FIGS. 20A, 20B, 21A, and 21B, with the manufacturing method of the semiconductor device according to the present embodiment, a pattern having a greater dimension than the sidewall film is formed utilizing the conversion difference between the mask pattern and a processing target material produced upon this etching without using lithography (resist mask).

Figure 20A:
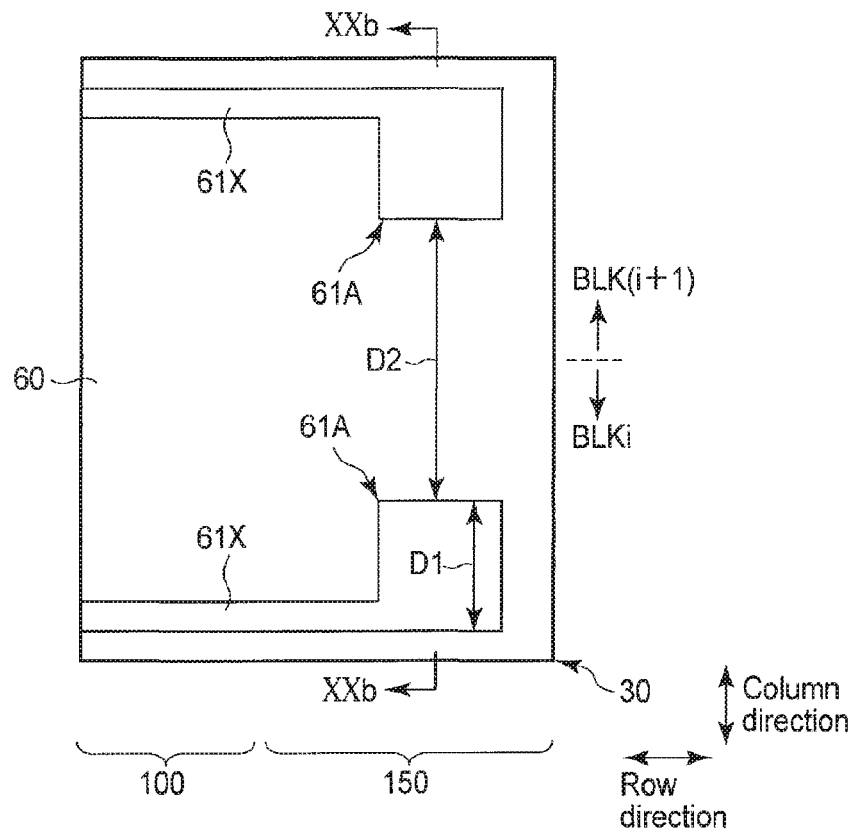
FIGS. 20A and 20B are views illustrating one process of a semiconductor device manufacturing method according to the second embodiment.
Figure 20B:
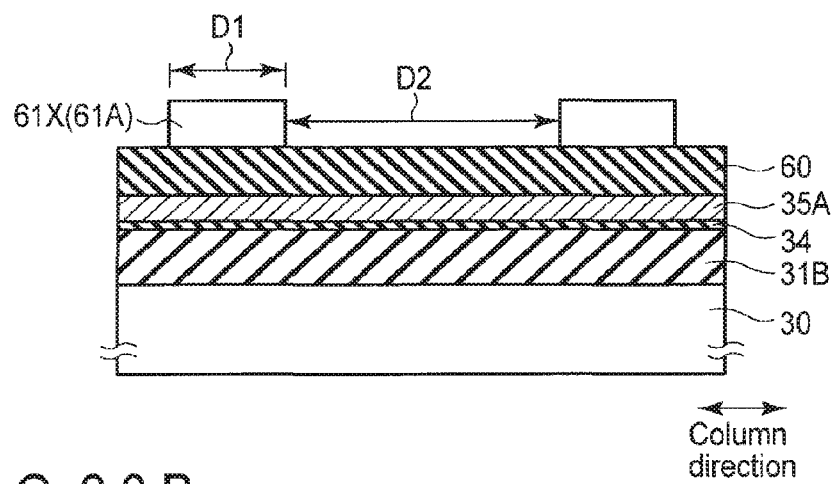

One process of a manufacturing method of the semiconductor device (flash memory) according to the present embodiment will be described using FIGS. 20A and 20B. FIG. 20A is a plan view of the memory cell array and drawing area in one process of a manufacturing method of the flash memory according to the present embodiment. FIG. 20B illustrates a sectional view along line XXb-XXb in FIG. 20A.

Similar to the first embodiment, as illustrated in FIGS. 20A and 20B, members for forming the transistors and word lines are formed in a memory cell array 100 and drawing area 150. A pattern transfer layer 60 is deposited on these formation members. A sacrificial layer 61 of a predetermined shape is formed on the pattern transfer layer 60. Further, sacrificial layers 61X are slimmed.

A projecting part 61A included in the sacrificial layer 61X has a dimension D1. Further, the adjacent projecting parts 61A have an interval D2. With the present embodiment, the size of interval D2 between the projecting parts 61A is formed to be greater than dimension D1. Hereinafter, the pattern having a greater interval to another adjacent pattern is also referred to as an "isolated pattern".

One process of a manufacturing method of the flash memory according to the present embodiment will be described using FIGS. 21A and 21B. FIG. 21A is a plan view of the memory cell array and drawing area in one process of a manufacturing method of the flash memory according to the present embodiment.

FIG. 21B illustrates a sectional view along line XXIb-XXIb in FIG. 21A.

A sidewall film (sacrificial sidewall film) 63 is formed by the first sidewall formation process on the lateral surface of the sacrificial layer 61X having the projecting part 61A. The sidewall film 63 has line width WS1.

After the sacrificial layer 61X is selectively removed, the pattern transfer layer is processed by the RIE method using the formed sidewall film 63 as a mask. The etching condition is adjusted such that the pattern conversion difference between the projecting part 61A and sidewall mask 63 of the isolated pattern in the drawing area 150 is greater than the pattern conversion difference between the sacrificial layer 61X and sidewall mask 63 in the memory cell array 100.

As described above, the sidewall films 63 which are adjacent across the boundaries of blocks BLKi and BLK(i+1) have interval D2 at portions matching the projecting parts 61A. Hence, a pattern transfer layer 60C formed to match the projecting part 61A is processed to have a dimension W3' greater than line width WS1 of the sidewall film 63 illustrated in FIG. 19.

Then, similar to the process illustrated in FIGS. 14 to 18C according to the first embodiment, the sidewall film (sidewall mask) is formed by the second sidewall formation process on the lateral surfaces of the transfer pattern layers 60 and 60C. After the second sidewall film is formed, the transfer pattern layer is selectively removed. Further, at a fringe formation position in the contact area, the resist mask is formed by photolithography.

As illustrated in FIGS. 21A and 21B, the transfer pattern layer 60C in the contact area has a greater dimension than line width WS1 of the sidewall film 63 for processing the transfer pattern layer. Hence, the sidewall films formed on the lateral surfaces of the transfer pattern layers 60C have a greater interval than line width WS1, and are adjacent. Consequently, as a result of securing the margin for forming the resist mask, it is possible to form the resist mask for forming fringes in the contact area such that one the resist mask does not cover a plurality of sidewall films.

By this means, it is possible to form interconnects extending from the memory cell array to the drawing area such that the interval between interconnects (for example, word lines) in the contact area is greater than the interval between the interconnects in the memory cell array.

In addition, the interval between the sidewall films is great in the boundary area between blocks BLKi and BLK(i+1). Hence, to prevent fluctuation of the line width of the pattern near the boundary area between the blocks, a dummy pattern or a mask pattern for forming select gate lines may be formed in the area in which the select gate lines are formed.

According to the above process, the semiconductor device according to the present embodiment is formed.

With the manufacturing method of the semiconductor device according to the present embodiment, when an underlayer is processed using the first sidewall film, it is possible to form the pattern 60C of dimension W3' greater than line width WS1 of the sidewall film 63 utilizing the difference in etching bias with respect to a pattern interval without forming the resist mask. By this means, it is possible to reduce a process of forming the resist mask for increasing the interval between the interconnects in the contact area such as photolithography and etching with respect to the resist mask. Consequently, according to the present embodiment, it is possible to simplify the manufacturing process of the semiconductor device and reduce manufacturing cost.

Also with the manufacturing method of the semiconductor device according to the second embodiment, it is possible to improve reliability of the semiconductor device including the fine pattern similar to the manufacturing method of the semiconductor device according to the first embodiment.

(3) Third Embodiment

A semiconductor device and manufacturing method of the semiconductor device according to the third embodiment will be described with reference to FIGS. 22 to 31B.

The manufacturing method of the semiconductor device has been described with the first embodiment which processes interconnects using a sidewall mask formed by performing a sidewall formation/transfer process a plurality of times.

Meanwhile, with the present embodiment, an interconnect pattern (line pattern) less than the dimension of the resolution of lithography is formed by the sidewall transfer technique, and, as long as the interconnect interval in area to form contacts has the dimension greater than the fine pattern of the sidewall transfer technique, the structure of an interconnect pattern is by no means limited. For example, similar to the semiconductor device (for example, flash memory) and manufacturing method of the semiconductor device according to the present embodiment illustrated in FIGS. 22 to 31B, interconnects (word lines) may adopt a structure embedded in the recesses formed by the sidewall transfer technique, that is, a damascene structure.

Although an example will be described with the present embodiment where only control gate electrodes are formed by adopting the damascene structure, the entire stack gate structure including a charge storage layer may be formed with the damascene structure.

Figure 22:
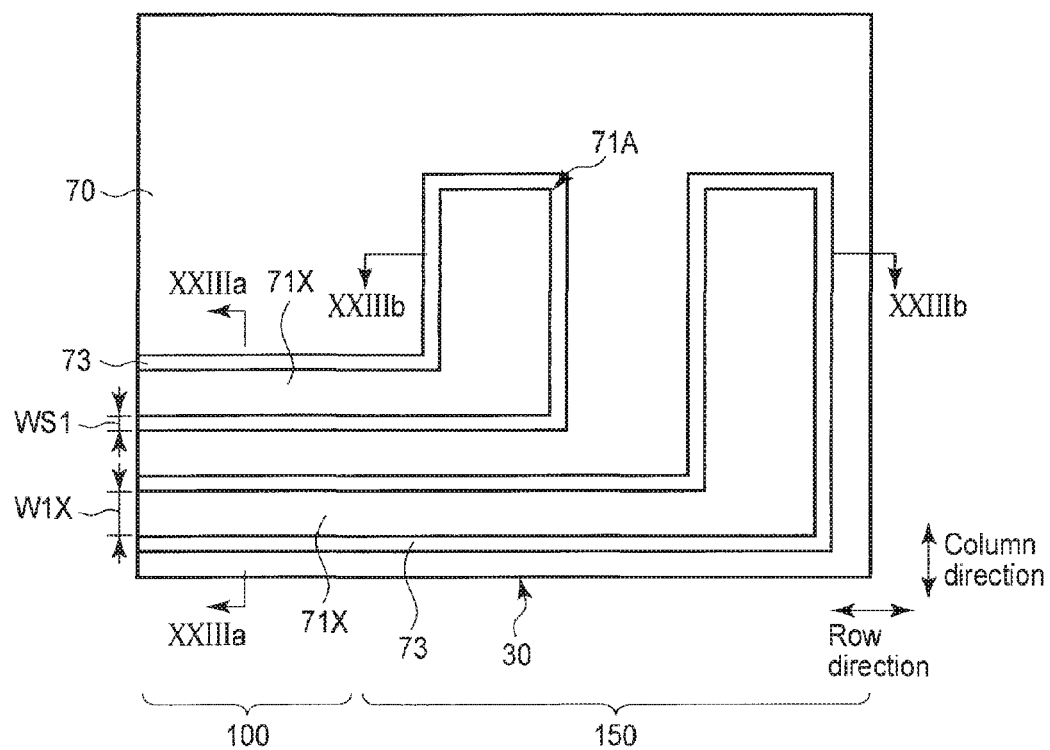
FIG. 22 is a plan view illustrating one process of a semiconductor device manufacturing method according to the third embodiment.
Figure 23A:
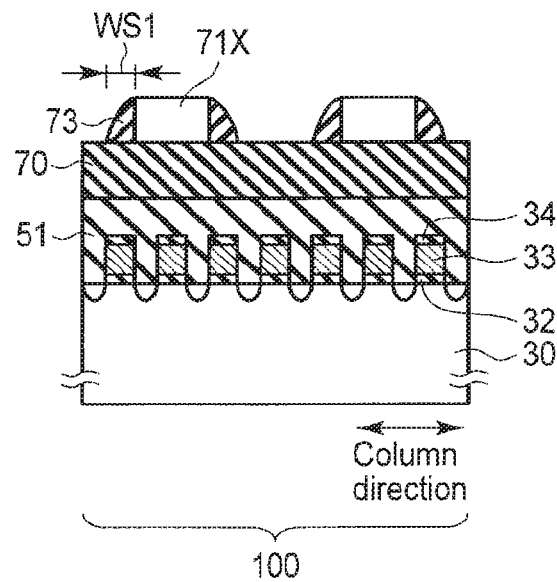
FIGS. 23A and 23B are sectional views illustrating one process of a semiconductor device manufacturing method according to the third embodiment.
Figure 23B:
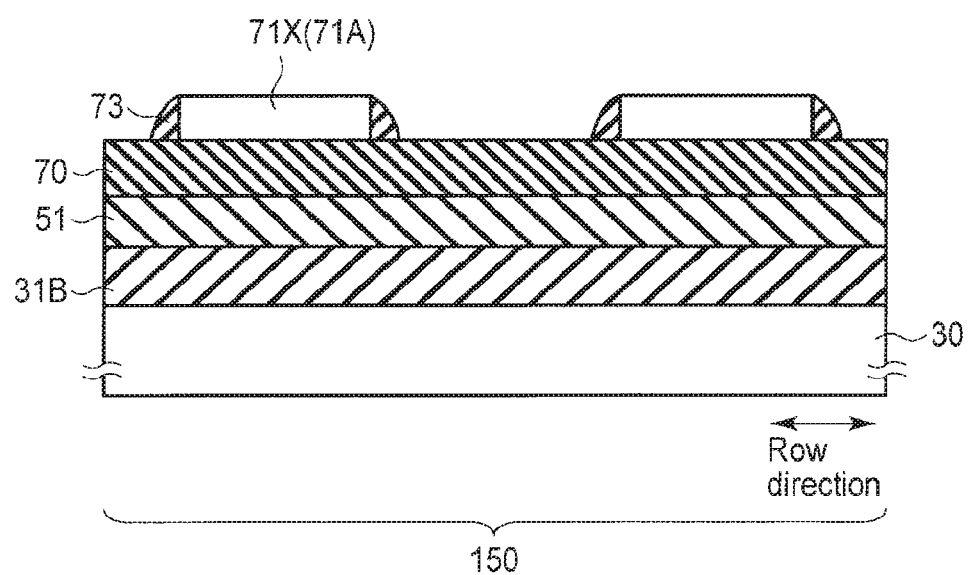

One process of a manufacturing method of a flash memory according to the present embodiment will be described using FIGS. 22, 23A and 23B. FIG. 22 is a plan view of the memory cell array and drawing area in one process of a manufacturing method of the flash memory according to the present embodiment. FIGS. 23A and 23B illustrate a cross-sectional structure in FIG. 22. FIG. 23A illustrates a sectional view along line XXIIIa-XXIIIa in FIG. 22. FIG. 23B illustrates a sectional view along line XXIIIb-XXIIIb in FIG. 22.

As illustrated in FIGS. 22, 23A and 23B, floating gate electrodes 33 are formed on a semiconductor substrate 30 in a memory cell array 100 by, for example, the sidewall transfer technique across gate insulating films 32 such that each memory cell is independent. The insulating film is formed on the floating gate electrode 33. The insulating film may be an intergate insulating film or dummy layer (mask layer). In addition, when the gate structure of the memory cell adopts a structure (for example, MONOS structure or SONOS structure) in which an insulating film including the trap level is used in the charge storage layer, the charge storage layer may not be separated per memory cell. Further, a source/drain diffusion layer may not be formed in the semiconductor substrate 30.

Further, an interlayer insulating film 51 is formed by the CVD method to cover the floating gate electrodes 33.

An insulating film 70 which is the pattern transfer layer is deposited on interlayer insulating film 51 by, for example, the CVD method.

Further, similar to the first embodiment, a sacrificial layer 71X having a predetermined pattern is formed on the insulating film 70. In the memory cell array 100, the sacrificial layer 71X has line width W1X. Line width W1X of the sacrificial layer 71X is about four times the line width of word lines WL to be formed. The sacrificial layer 71X may be slimmed to reduce the line width, or may be formed at the limit dimension of the resolution of lithography without being slimmed.

In a drawing area 150, a projecting part 71A is formed in the sacrificial layer 71X. The short side of the projecting part 71A of the sacrificial layer 71X is patterned and processed to have a dimension (line width) greater than line width W1X of the sacrificial layer 71X in the memory cell array 100.

Further, a first sidewall film (sacrificial sidewall film) 73 is formed by the first sidewall formation process (sidewall transfer process) on the lateral surface of the sacrificial layer 71X. The sidewall film 73 has line width WS1 smaller than the limit dimension of the resolution of lithography.

In the drawing area 150, the interval between the sidewall films 73 opposing across the projecting part 71A of the sacrificial layer 71X is greater than line width W1X.

Figure 25A:
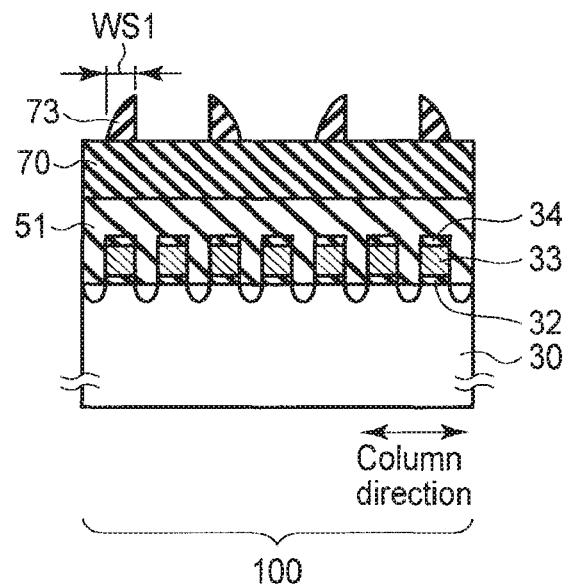
FIGS. 25A and 25B are sectional views illustrating one process of a semiconductor device manufacturing method according to the third embodiment.
Figure 25B:
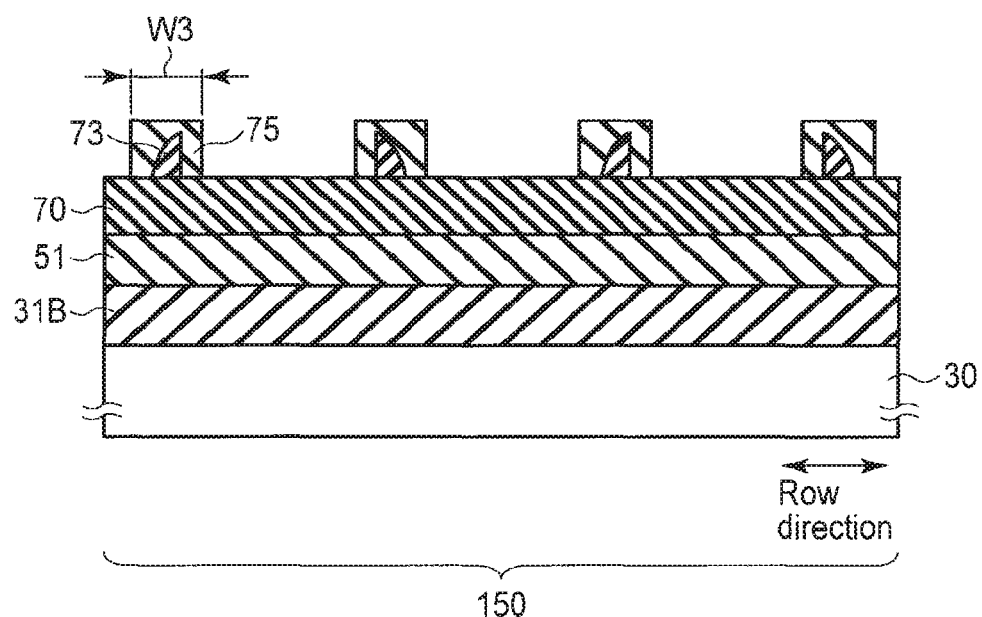

One process of a manufacturing method of the flash memory according to the present embodiment will be described using FIGS. 24, 25A and 25B. FIG. 24 is a plan view of the memory cell array and drawing area in one process of a manufacturing method of the flash memory according to the present embodiment. FIGS. 25A and 25B illustrate a cross-sectional structure in FIG. 24. FIG. 25A illustrates a sectional view along line XXVa-XXVa in FIG. 24. FIG. 25B illustrates a sectional view along line XXVb-XXVb in FIG. 24.

As illustrated in FIGS. 24, 25A and 25B, after the sacrificial layer for forming the sidewall films 73 is removed, resist masks 75 of a predetermined pattern are formed by the photolithography technique in the drawing area 150. The resist mask 75 covers the sidewall film 73 in the contact area in the drawing area 150. Dimension W3 of the resist mask 75 is greater than line width WS1 of the sidewall mask 73.

One process of a manufacturing method of the flash memory according to the present embodiment will be described using FIGS. 26, 27A and 27B. FIG. 26 is a plan view of the memory cell array and drawing area in one process of a manufacturing method of the flash memory according to the present embodiment. FIGS. 27A and 27B illustrate a cross-sectional structure in FIG. 26. FIG. 27A illustrates a sectional view along line XXVIIa-XXVIIa in FIG. 26. FIG. 27B illustrates a sectional view along line XXVIIb-XXVIIb in FIG. 26.

As illustrated in FIGS. 26, 27A and 27B, after a pattern transfer layer 70A is processed based on patterns of the sidewall films and resist masks, the sidewall films and resist masks are removed. Further, a sidewall film (sidewall mask) 77 is formed by the second sidewall formation process on the lateral surface of the processed pattern transfer layer 70A. Line width WS2 of the sidewall film 77 is smaller than the limit dimension of the resolution of lithography. The second sidewall film 77 is formed at a position where the second sidewall film 77 does not overlap the floating gate electrode (or dummy layer) 33 of the memory cell in a vertical direction, and the sidewall film 77 is arranged above, for example, the source/drain of the transistor.

In the memory cell array 100, the line width of the pattern transfer layer (sacrificial line pattern layer) 70A is substantially the same as line width WS1 of the sidewall sacrificial film for patterning the transfer layer 70A. In the contact area of the drawing area 100, dimension (line width) W3 of a pattern transfer layer (sacrificial rectangular pattern layer) 70B is substantially the same as dimension W3 of the resist mask for patterning the transfer layer 70B.

In addition, in the memory cell array 100, preferably, the interval between sidewall masks 77 opposing without sandwiching the sacrificial line pattern layer 70A is substantially the same as line width WS2 of the sidewall mask 77 or line width WS1 of the sacrificial line pattern layer 70A. Further, in the contact area of the drawing area 150, the interval between the sidewall masks 77 opposing without sandwiching the sacrificial rectangular pattern layer 70B is set to the dimension greater than the double line width WS2 of the sidewall mask 77.

Figure 28:
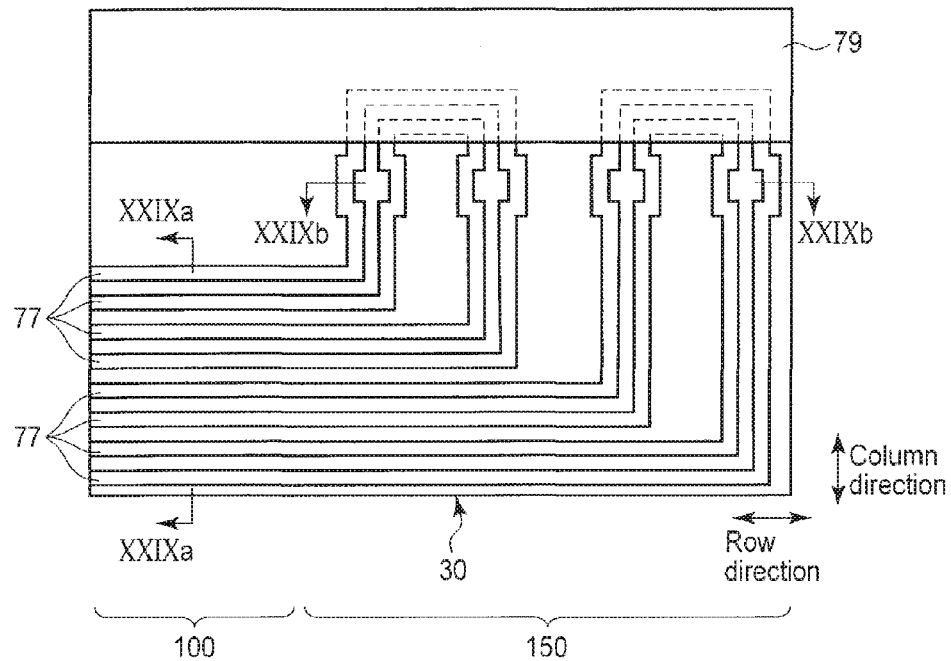
FIG. 28 is a plan view illustrating one process of a semiconductor device manufacturing method according to the third embodiment.
Figure 29A:
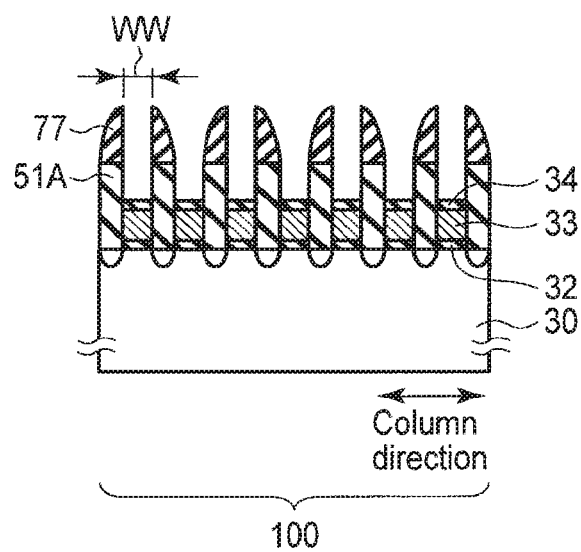
FIGS. 29A and 29B are sectional views illustrating one process of a semiconductor device manufacturing method according to the third embodiment.
Figure 29B:
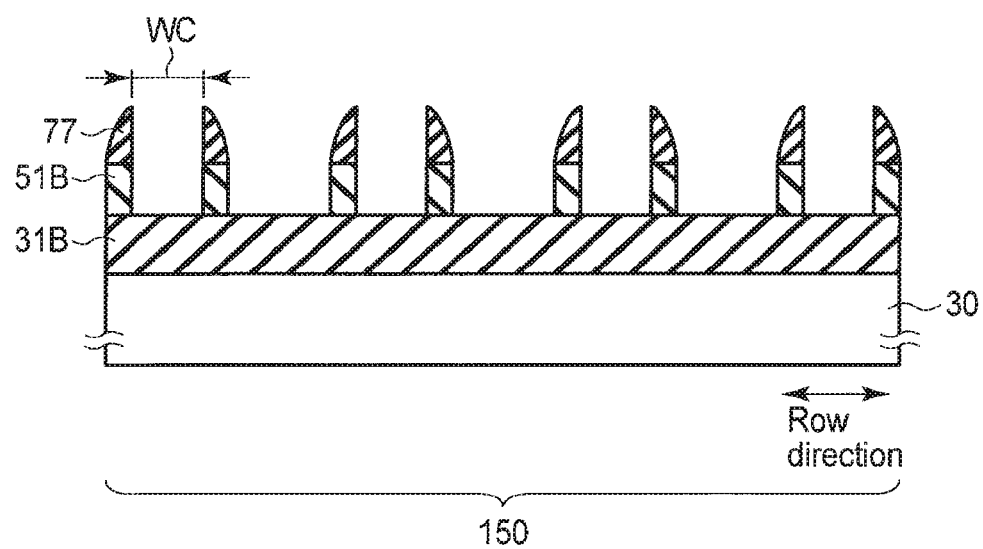

One process of a manufacturing method of the flash memory according to the present embodiment will be described using FIGS. 28, 29A and 29B. FIG. 28 is a plan view of the memory cell array and drawing area in one process of a manufacturing method of the flash memory according to the present embodiment. FIGS. 29A and 29B illustrate a cross-sectional structure in FIG. 28. FIG. 29A illustrates a sectional view along line XXIXa-XXIXa in FIG. 28. FIG. 29B illustrates a sectional view along line XXIXb-XXIXb in FIG. 28.

As illustrated in FIGS. 28, 29A and 29B, the sacrificial pattern layer is selectively removed such that the sidewall films 77 are left. A resist mask 79 is formed to cover a loop portion of the sidewall films 77 in the drawing area 150. In addition, although not illustrated, at the same time when the resist mask 79 is formed, a resist mask for forming the select gate lines (select transistors) may be formed.

Further, an interlayer insulating film 51A is etched using the sidewall films 77 and resist 79 as masks. By this means, in the memory cell array 100, openings are made above the floating gate electrodes 33, and the damascene recesses for embedding the gate electrodes are formed in interlayer insulating film 51A. The width of the formed recess is smaller than the limit dimension of the resolution of lithography, and corresponds to the interconnect width WW of the word lines. For example, the width of the recesses in which the word lines are embedded is equal to (k1/2″)×(λ/NA), above. For example, the width of the recesses (interconnect width) WW is the width of the first sidewall mask (sacrificial sidewall film) or less, and, more preferably, is half the width of the first sidewall mask or less.

In the drawing area 150, the damascene recesses (hereinafter referred to as "contact recesses") in which contacts (fringes) are embedded are formed in an interlayer insulating film 51B by etching using the sidewall film 77 as a mask. A width WC of the contact recesses formed in interlayer insulating film 51B is, for example, wider than line width WW of the recesses in which the word lines are embedded.

In addition, with a specific example, when the recesses in which the word lines and contacts are embedded are formed by performing the sidewall formation/transfer process twice, the damascene recesses in which the word lines are embedded are preferably 19 nm or less, and the damascene recesses in which the contacts are embedded are preferably 30 nm or greater. Further, when the damascene recesses in which the word lines and contacts are embedded are formed by performing the sidewall formation/transfer process three times, the damascene recesses in which the word lines are embedded are preferably 9.5 nm or less, and the damascene recesses in which the contacts are embedded are preferably greater than 15 nm.

Further, the loop portion of the sidewall films 77 in the drawing area 150 is covered by the resist mask 79, so that the damascene recesses formed in interlayer insulating films 51A and 51B are respectively independent patterns.

Figure 30:
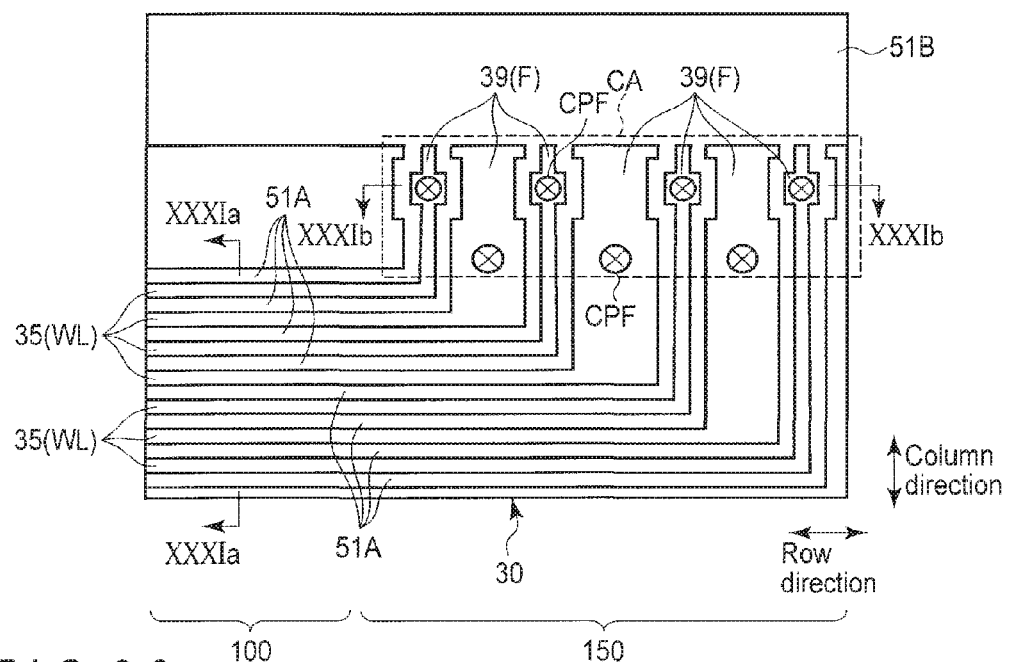
FIG. 30 is a plan view illustrating one process of a semiconductor device manufacturing method according to the third embodiment.

One process of a manufacturing method of the flash memory according to the present embodiment will be described using FIGS. 30, 31A and 31B. FIG. 30 is a plan view of the memory cell array and drawing area in one process of a manufacturing method of the flash memory according to the present embodiment. FIGS. 31A and 31B illustrate a cross-sectional structure in FIG. 30. FIG. 31A illustrates a sectional view along line XXXIa-XXXIa in FIG. 30. FIG. 31B illustrates a sectional view along line XXXIb-XXXIb in FIG. 30.

As illustrated in FIGS. 30, 31A and 31B, after the sidewall films for forming the damascene recesses are removed, conductors are deposited on interlayer insulating films 51A and 51B such that the damascene recesses are buried. The conductor is made of, for example, metal or conductive polysilicon.

Then, CMP processing and etch-back are applied to the conductor using interlayer insulating films 51A and 51B as stoppers such that the conductor is left in the damascene recess in a self-aligning manner.

By this means, in the memory cell array 100, control gate electrodes 35 adopting the damascene gate structure are formed. The control gate electrodes 35 function as the word lines WL, and extend from the inside of the memory cell array 100 to the inside of the drawing area 150.

In the drawing area 150, the word lines and contacts 39 adopting a damascene structure are formed. In the contact area CA, dimension WC of the contact is wider than line width WW of the word lines WL, and has the dimensions matching the sacrificial layer patterned by the resist mask or lithography. In addition, in the contact area CA, the contacts 39 are adjacent sandwiching the insulating films 51B having the dimension matching the line width of the sidewall mask.

Further, similar to the first embodiment, the interlayer insulating film (not illustrated) is deposited to cover the word lines and contact parts. Further, at positions meeting the contacts 39, contact holes are formed in the interlayer insulating film. In this contact hole, the conductor is embedded, and a contact plug CPF is formed on the contact 39. Then, the interlayer insulating film and interconnect layer (metal layer) are sequentially layered.

According to the above manufacturing process, the semiconductor device according to the present embodiment is formed.

As illustrated in FIGS. 22 to 31B, with the manufacturing method of the semiconductor device formed by performing the sidewall formation process (sidewall transfer process) a plurality of times, at a position at which a contact is formed, a resist mask is formed to cover the $n^{th}$ sidewall film in order to form the $(n+1)^{th}$ sidewall film. The conductor is embedded in the recess in the interlayer insulating film formed by pattern transfer using the $(n+1)^{th}$ sidewall film. By this means, the interconnect patterns adopting the damascene structure, gate electrodes of the transistors and contacts are formed. Consequently, also with the present embodiment, it is possible to form interconnects smaller than the limit dimension of the resolution of lithography and contacts greater than the interconnect width of the interconnects.

With the present embodiment, the size of the contacts 39 can be set by controlling the dimensions of the resist mask and sacrificial layer patterned by lithography. Consequently, when the contacts are adjacent at the interval of about the line width of the sidewall mask, it is possible to prevent short-circuiting of the contact plugs and interconnects (word lines) by controlling the sizes of the resist mask and sacrificial layer to secure the margin for misalignment of the contact plugs.

Further, with the present embodiment, the resist mask which covers the $(n+1)^{th}$ sidewall film (sidewall mask) for patterning the contacts may not be formed. Consequently, with the manufacturing method described with the present embodiment, it is possible to reduce the manufacturing process (for example, photolithography for patterning the resist) of the semiconductor device, and reduce manufacturing cost of the semiconductor device.

Consequently, with the semiconductor device and manufacturing method of the semiconductor device according to the third embodiment, it is possible to provide the same effect as the first and second embodiments, and improve reliability of the semiconductor device including a fine pattern.

(4) Fourth Embodiment

A manufacturing method of a semiconductor device according to the fourth embodiment will be described with reference to FIGS. 32A to 34B. In addition, the same components and manufacturing process as in the first to third embodiments will be described where necessary.

Similar to word lines WL, bit lines BL are formed according to a pattern of a line-and-space pattern which is finer than the limit dimension of the resolution of lithography. The bit lines BL may be formed to be embedded in damascene recesses formed using the sidewall transfer technique described with the third embodiment.

Hereinafter, a method of forming the bit lines adopting the damascene structure will be described using FIGS. 32A to 34B.

One process of a manufacturing method of a flash memory according to the present embodiment will be described using FIGS. 32A and 32B. FIGS. 32A and 32B are sectional views illustrating one process of a manufacturing method of the flash memory according to the present embodiment. FIG. 32A is a sectional view of a memory cell array 100 in the row direction, and FIG. 32B is a sectional view of a drawing area 160 provided adjacent to the memory cell array in the column direction. For example, the planar structure in a manufacturing process illustrated in FIGS. 32A and 32B is similar to FIG. 24. In addition, although an example is illustrated where an element is not formed on a semiconductor substrate 30 in the drawing area 160 in the column direction of the memory cell array for ease of description, it naturally follows that dummy cells and field-effect transistors of peripheral circuits may be provided on the semiconductor substrate 30.

As illustrated in FIGS. 32A and 32B, after the memory cells and word lines WL are formed on the semiconductor substrate 30, a first interlayer insulating film 51 is formed on the semiconductor substrate 30 to cover the memory cells and word lines WL. Further, in interlayer insulating film 51, contact plugs CP are embedded and, on interlayer insulating film 51, first interconnect layers M0 of a predetermined pattern are formed. On interlayer insulating film 51 and interconnect layer M0, a second interlayer insulating film 52 is deposited. Further, in the second interlayer insulating film 52, via plugs V1 are embedded to be connected to the first interconnect layer M0. On the via plugs V1 and interlayer insulating films 52, a third interlayer insulating film 53A is deposited.

Further, substantially similar to the process illustrated in FIGS. 22 to 25B, the sacrificial layer for forming the sidewall film is formed on interlayer insulating film 53A. With the present embodiment, a linear core for forming the bit lines is formed to extend in the column direction in the memory cell array 100. For example, similar to the example illustrated in FIG. 22, the sacrificial layer is formed to be bent in the row direction in the drawing area 160. The dimension (line width and dimension in the column direction) of the sacrificial layer in the drawing area 160 is greater than the dimension (line width and dimension in the row direction) of the sacrificial layer in the memory cell array 100.

On the lateral surface of the sacrificial layer, a sidewall film (sacrificial sidewall film) 83 of a predetermined line width WS1 is formed by the first sidewall formation process. As illustrated in FIGS. 32A and 32B, after the sidewall films 83 are formed, the sacrificial layers are selectively removed from above interlayer insulating films 83.

Further, as illustrated in FIG. 32B, in the drawing area 160, resist masks 85 are formed to cover the sidewall films 83. The resist mask 85 is provided at a position to form a contact (fringe). Similar to the above, dimension W3 of the resist mask 85 is greater than line width WS1 of the sidewall film 83.

Figure 33A:
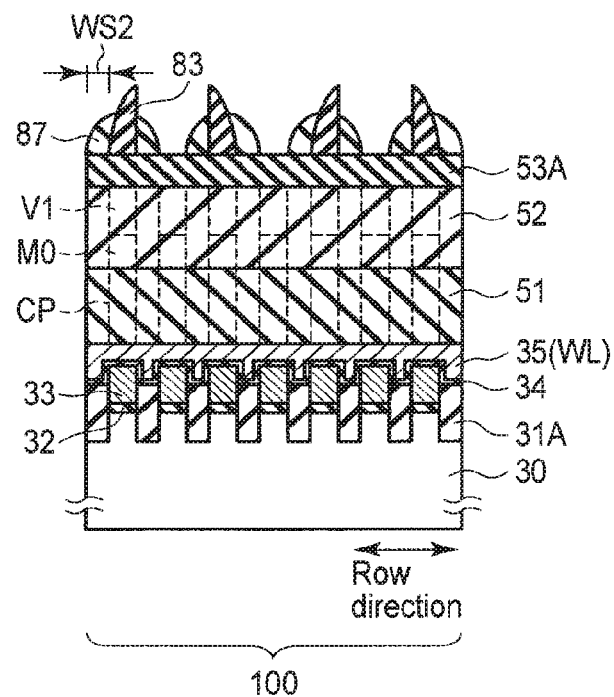
FIGS. 33A and 33B are sectional views illustrating one process of a semiconductor device manufacturing method according to the fourth embodiment.
Figure 33B:
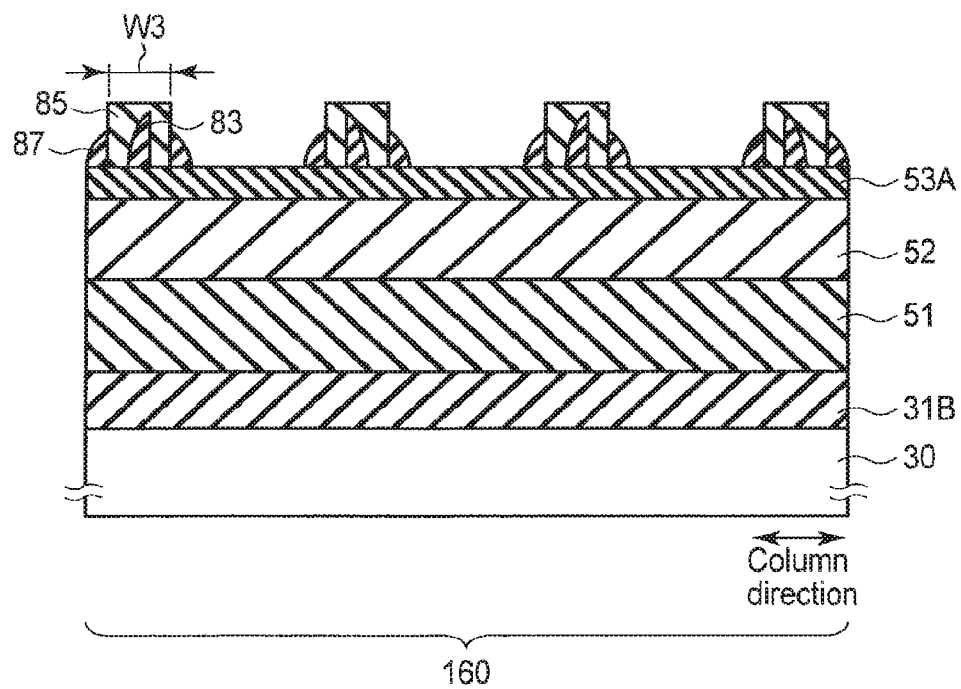

One process of a manufacturing method of the flash memory according to the present embodiment will be described using FIGS. 33A and 33B. FIGS. 33A and 33B are sectional views illustrating one process of a manufacturing method of the flash memory according to the present embodiment. FIG. 33A is a sectional view of the memory cell array 100 in the row direction, and FIG. 33B is a sectional view of the drawing area 160 provided adjacent to the memory cell array in the column direction. For example, the planar structure in the manufacturing process illustrated in FIGS. 33A and 33B is similar to FIG. 26.

As illustrated in FIGS. 33A and 33B, sidewall films (sidewall masks) 87 of a loop are formed by, for example, the second sidewall formation process on the lateral surfaces of the sacrificial sidewall film 83 and resist mask 85. Line width WS2 of the sidewall mask 87 is the limit dimension of the resolution of lithography or less, and is, for example, line width WS1 of the sacrificial sidewall film 83 or less. For example, line width WS2 of the sidewall mask 87 is equal to $(k1/2'') \times (\lambda/NA)$. For example, in the memory cell array 100, a plurality of sidewall masks 87 may be adjacent in the row direction at nearly the same interval as line width WS1 of the sacrificial sidewall film 83. In addition, the material of the sidewall mask 87 different from the sacrificial sidewall film 83 and resist mask 85 is used to secure a predetermined etching selectivity.

Further, in the contact area in the drawing area 160, the sidewall masks 87 surrounding the resist masks 85 are adjacent in a direction to cross the direction in which the sidewall masks 87 extend, at an interval matching line width W3 (or line width of the sacrificial layer) of the resist mask 85. That is, the sidewall masks 87 in the drawing area 160 are adjacent at interval W3 greater than line width WS1 of the sacrificial sidewall film 83.

Thus, the second sidewall film is formed on the lateral surface of the first sidewall film, so that it is possible to remove the process of forming the sacrificial layer and simplify the manufacturing process. In addition, similar to the first to third embodiments, patterns of the sacrificial sidewall film 83 and resist mask 85 are transferred to the transfer pattern layer on interlayer insulating film 53, and the sidewall mask 87 may be formed on the lateral surface of the transfer pattern layer.

One process of a manufacturing method of the flash memory according to the present embodiment will be described using FIGS. 34A and 34B. FIGS. 34A and 34B are sectional views illustrating one process of a manufacturing method of the flash memory according to the present embodiment. FIG. 34A is a sectional view of the memory cell array 100 in the row direction, and FIG. 34B is a sectional view of the drawing area 160 provided adjacent to the memory cell array in the column direction. For example, the planar structure in manufacturing process illustrated in FIGS. 34A and 34B is similar to FIGS. 28 and 30.

As illustrated in FIGS. 34A and 34B, after the sacrificial sidewall films and resist mask are selectively removed, similar to the process illustrated in FIG. 28, the resist mask (not illustrated) is formed to cover the loop portion of the sidewall masks. Further, interlayer insulating film 87 is etched using the sidewall mask 87 and resist mask as masks. By this means, a plurality of independent damascene recesses are formed in interlayer insulating film 53.

In the memory cell array 100, the damascene recesses are formed according to the interval between the adjacent sidewall masks. Further, the conductors (for example, metal) are embedded in the damascene recesses in a self-aligning manner, thereby forming the bit lines BL adopting the damascene structure.

At the same time when the bit lines BL are formed, the contacts 39 (M2) are formed in the damascene recesses formed in the drawing area 160.

The damascene recesses in the memory cell array 100 have a line width less than the limit dimension of the resolution of lithography. The line width of the bit lines BL is determined according to the dimension matching the line width of the damascene recesses.

Further, the damascene recesses in the drawing area 160 have a line width (the dimension of the short side) greater than the damascene recesses in the memory cell array 100, in other words, the line width of the sidewall mask, being greater than or equal to $(k1/2^n) \times (\lambda/NA)$.

According to the above manufacturing process, with the manufacturing method of the flash memory according to the present embodiment, the bit lines adopting the damascene structure having the line width smaller than the limit dimensions of the resolution of lithography is formed by performing the sidewall formation process a plurality of times and using damascene method. Further, according to the process performed at substantially the same time when the bit lines are formed, the contacts connected to the bit lines BL and having the dimension greater than line width BL of the bit lines are formed.

The manufacturing method of the semiconductor device according to the present embodiment provides the same effect as the first to third embodiments.

As described above, with the manufacturing method of the semiconductor device according to the fourth embodiment, it is possible to improve reliability of the semiconductor device including the fine pattern similar to the first to third embodiments.

(5) Layout Example

Layout examples in the drawing area of the semiconductor device according to the present embodiment will be described with reference to FIGS. 35 to 40.

FIGS. 35 and 36 illustrate layout examples different from the layout example illustrated in FIG. 4. With the layout examples illustrated in FIGS. 35 and 36, a plurality of fringes 39 are aligned on a single line in each of blocks BLKi and BLK(i+1).

Thus, arrangement of the fringes 39 in the drawing area 150 has a periodicity, thereby facilitating process of the fringes 39.

In addition, the portions to connect the fringes 39 to the word lines WL may be front ends of the word lines WL as illustrated in FIG. 35, or may be the lateral surfaces of the word lines WL as illustrated in FIG. 36.

As illustrated in FIG. 37, the drawing areas 150 are provided at one end and the other end of the memory cell array 100 respectively. In this case, the word lines WL in the two adjacent blocks BLKi and BLK(i+1) are drawn respectively in the drawing areas 150 on the opposite sides.

Figure 38:
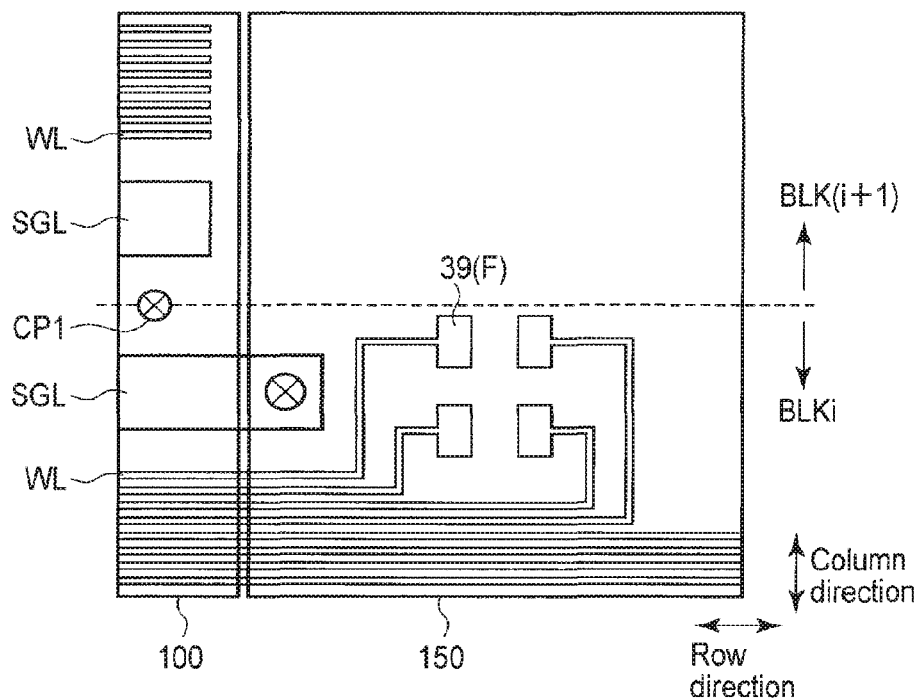
FIG. 38 is a view illustrating a layout example in a drawing area of a semiconductor device according to an embodiment.
Figure 39:
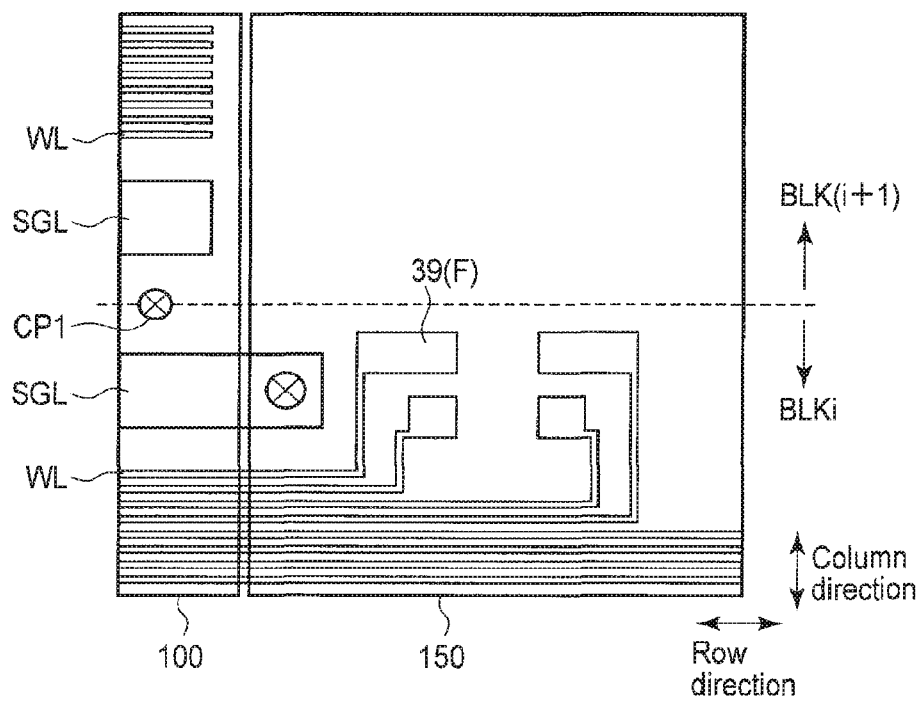
FIG. 39 is a view illustrating a layout example in a drawing area of a semiconductor device according to an embodiment.

FIGS. 38, 39 and 40 illustrate layout examples in the drawing area 150 when the word lines WL in each block are drawn to the opposite sides. In addition, when the drawing areas 150 are provided on the both sides of the memory cell array, the layout in both of the drawing areas 150 is substantially the same. Hence, FIGS. 38 to 40 illustrate only the layout in the drawing area 150 on one end side of the memory cell array 100.

With the layout example illustrated in FIG. 38, the fringes 39 are arranged to be adjacent in the row direction and column direction. When the drawing areas 150 are arranged at both ends of the memory cell array 100, the word lines WL in block BLKi may be drawn from the area adjacent to block BLKi side to the area adjacent to block BLK(i+1) side across the boundary between blocks BLKi and BLK(i+1). Consequently, when the drawing areas 150 are provided at both ends of the memory cell array 100, the degree of freedom of the layout of the word lines in each block increases. Consequently, in the drawing area 150, it is possible to increase the interval between the adjacent word lines and the interval between contacts in the contact area, and further improve the processing margin of the contacts.

With the layout example illustrated in FIG. 39, the fringes 39 project to oppose to each other. The sizes of the fringes 39 may vary per word line WL.

Further, with the layout example illustrated in FIG. 40, the fringes 39 connected respectively to the adjacent word lines WL are arranged to project toward the opposite sides in the column direction.

The layouts illustrated in FIGS. 35 to 40 can be formed by adequately setting a position to form the resist mask with respect to the sidewall film in each process.

Also with the layout examples illustrated in FIGS. 35 to 40, at positions to form the contacts in the contact area CA, the interval between the word lines WL in the contact area is greater than the interval between the word lines WL in the memory cell array 100. Further, the dimension of the contacts is formed to be greater than the line width of the word lines by patterning using the resist mask by lithography.

When, for example, the word lines are formed by performing the sidewall formation process (sidewall transfer process) twice (n+1=2, that is, n=1), the word lines are aligned in the memory cell array at the one fourth of the pitch compared to the dimension of the sacrificial layer for forming the first sidewall film. In this case, the line width (minimum dimension) of the word lines or the interval between the word lines is preferably set to less than 19 nm, and the interconnect interval between the word lines in the contact area is preferably set to greater than 30 nm. When, for example, the word lines are formed by performing the sidewall formation process three times (n+1=3, that is, n=2), the word lines are aligned in the memory cell array at the one eighth of the pitch compared to the dimension of the sacrificial layer for forming the first sidewall film. In this case, the line width of the word lines or the interval between the word lines is preferably set to less than 9.5 nm, and the interconnect interval between the word lines in the contact area is preferably set to greater than 15 nm.

Also in the structure illustrated with the present layout examples in FIGS. 35 to 40, it is possible to provide the same effect as in the first to fourth embodiments, and improve reliability of the semiconductor device.

(6) Modified Example

With the first to fourth embodiments, a structure of interconnects formed based on the $(n+1)^{th}$ sidewall mask of the sidewall formation/transfer process and manufacturing method of the structure have been described using the flash memory as an example.

Meanwhile, the present embodiment is by no means limited to the flash memory, and the above embodiments may be applied to a volatile semiconductor memory such as DRAM or SRAM. Further, the present embodiment may be applied to a resistance change memory such as magnetoresistive RAM (MRAM), phase-change RAM (PCRAM) or resistive RAM (ReRAM) which uses as a memory element an element which reversibly changes resistance. For example, the present embodiment is used for the interconnect (word lines/bit lines) of a crosspoint memory cell array included in the resistance change type memory and the contacts connected to the interconnects.

Further, the present embodiments are by no means limited to these memories, and, in the logic circuit formed by, for example, a field-effect transistor (FET) including a gate electrode of the planar structure or fin FET, interconnects connected to FET or contacts (fringes) connected to the gate electrodes and interconnects may be formed by the structure and manufacturing method described with the embodiment.

Also with these modified examples, it is possible to apply the manufacturing method described in the first to fourth embodiments, and provide the effect described in the first to fourth embodiments.

OTHER

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate including an element formation area and a drawing area, the element formation area and the drawing area being arranged in a row direction;
a plurality of semiconductor elements provided in the element formation area;
a plurality of word lines extending from the element formation area to the drawing area, and connected to the semiconductor elements, the word lines extending in the row direction in the element formation area; and
a plurality of contacts provided in the drawing area and each connected to a corresponding one of the plurality of word lines at a portion of an edge of each of the contacts, the portion being apart from both sides of each of the contacts and excluding corners of the contacts, the both sides sandwiching the edge, the edge being a nearest edge to a tip of the corresponding one of the word lines to be connected,
wherein upper edges of the contacts are aligned on a single line, the single line being parallel to the row direction, each of the upper edges being opposite to the edge connected to the corresponding one of the word lines,
wherein the semiconductor elements are arranged in rows and columns, the drawing area includes a first region and a second region being adjacent in a column direction which is different from the row direction, the word lines are bent to a side of a boundary between the first and second regions in the drawing area, the contacts includes a first contact in the first region and a second contact in the second region, and the first contact is adjacent to the second contact in the column direction.

2. The semiconductor device according to claim 1, wherein each of the contacts is rectangular.

3. The semiconductor device according to claim 1, wherein the semiconductor elements include select gate transistors, the select gate transistors being connected to a select gate line, and the plurality of contacts being arranged substantially in line with an elongating line of the select gate line.

4. The semiconductor device according to claim 1, wherein the select gate line is in parallel with the word lines and the word lines are bent at a right angle in the drawing area toward corresponding ones of the contacts.

5. The semiconductor device according to claim 1, wherein:
a first dimension matching a width of each of the word lines and an interval between the word lines adjacent in the element formation area is formed smaller than a limit dimension of resolution of lithography defined as a following equation:

$$k1 \times (\lambda/NA)$$

where k1 is a process parameter in the lithography, $\lambda$ is a wavelength of a light source used for the lithography, and NA is a numerical aperture of a lens of an exposure device, and a second dimension matching an interval between the word lines adjacent in the drawing area is greater than the first dimension.

6. The semiconductor device according to claim 5, wherein a dimension of the contacts is greater than the first dimension.

7. The semiconductor device according to claim 5, wherein an interval between the contacts connected to adjacent ones of the word lines is greater than the first dimension.

8. The semiconductor device according to claim 1, wherein each of the semiconductor elements is a field-effect transistor including a charge storage layer and a control gate electrode.

9. The semiconductor device according to claim 8, wherein the word lines are connected to the control gate electrode.

10. The semiconductor device according to claim 1, wherein the semiconductor elements are arranged in rows and columns, the contacts are arranged in two rows to be adjacent to each other in a column direction which is different from the row direction.

* * * * *